United States Patent
Zhang et al.

(10) Patent No.: US 12,278,295 B1
(45) Date of Patent: Apr. 15, 2025

(54) SOLAR CELL, METHOD FOR MANUFACTURING SOLAR CELL, AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Bike Zhang, Zhejiang (CN); Jingsheng Jin, Zhejiang (CN); Guangming Liao, Zhejiang (CN); Xinyu Zhang, Zhejiang (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 18/439,654

(22) Filed: Feb. 12, 2024

(30) Foreign Application Priority Data

Oct. 13, 2023 (CN) .......................... 202311330430.5

(51) Int. Cl.
*H01L 31/0216* (2014.01)
*H01L 31/0224* (2006.01)

(52) U.S. Cl.
CPC .................. *H01L 31/02167* (2013.01); *H01L 31/022433* (2013.01)

(58) Field of Classification Search
CPC .................. H01L 31/02167; H01L 31/022433
See application file for complete search history.

(56) References Cited

U.S. PATENT DOCUMENTS

| | | | |
|---|---|---|---|
| 2009/0308457 A1* | 12/2009 | Smith | H01L 31/035281 257/E31.004 |
| 2010/0218821 A1 | 9/2010 | Kim et al. | |
| 2011/0126877 A1 | 6/2011 | Kim et al. | |
| 2011/0126906 A1* | 6/2011 | Ko | H01L 31/1868 438/73 |
| 2015/0280029 A1 | 10/2015 | Harley et al. | |
| 2017/0213921 A1* | 7/2017 | Yang | H01L 31/0682 |
| 2018/0277701 A1 | 9/2018 | Lenes et al. | |

(Continued)

FOREIGN PATENT DOCUMENTS

| | | |
|---|---|---|
| CN | 110071182 A | 7/2019 |
| CN | 218769554 U | 3/2023 |
| DE | 202023101427 U1 | 6/2023 |

(Continued)

OTHER PUBLICATIONS

Georgiev ("Optimal distance between current collecting electrodes of the solar cells"), Solid-State Electronics 51 (2007) 376-380 (Year: 2007).*

(Continued)

*Primary Examiner* — Angelo Trivisonno
(74) *Attorney, Agent, or Firm* — USCH Law, PC

(57) ABSTRACT

A solar cell, a manufacturing method thereof, and a photovoltaic module are provided. The solar cell includes a substrate having electrode regions and non-electrode regions that are alternatingly arranged in a first direction, where the non-electrode regions of the substrate include a plurality of first regions and a plurality of second regions; a doped conductive layer formed over the dielectric layer; a passivation layer formed over the first regions and the doped conductive layer; and a plurality of electrodes.

16 Claims, 15 Drawing Sheets

(56) References Cited

U.S. PATENT DOCUMENTS

2019/0157478 A1   5/2019   Watabe et al.
2023/0088548 A1   3/2023   Yu et al.

FOREIGN PATENT DOCUMENTS

| EP | 2395554 A2 | 12/2011 | |
|---|---|---|---|
| EP | 2804219 B1 | 10/2019 | |
| JP | 2005101240 A | 4/2005 | |
| JP | 2010258043 A | 11/2010 | |
| JP | 2011029625 A | 2/2011 | |
| JP | 2013008960 A | 1/2013 | |
| JP | 2013042126 A | 2/2013 | |
| JP | 2013093543 A | 5/2013 | |
| JP | 2014204128 A | 10/2014 | |
| JP | 2014212219 A | 11/2014 | |
| JP | 2017126748 A | 7/2017 | |
| JP | 2018098520 A | 6/2018 | |
| JP | 2022058069 A | 4/2022 | |
| JP | 2023086063 A | 6/2023 | |
| WO | WO-2007120197 A2 * | 10/2007 | .............. C08L 83/14 |
| WO | 2013069324 A1 | 5/2013 | |

OTHER PUBLICATIONS

Zhejiang Jinko Solar Co., Ltd., et al., Extended European Search Report, EP 24156670.2, Jul. 31, 2024, 22 pgs.
Zhejiang Jinko Solar Co., Ltd., et al., Extended European Search Report, EP 24159415.9, Aug. 16, 2024, 11 pgs.
Zhejiang Jinko Solar Co., Ltd et al., Non-Final Rejection, U.S. Appl. No. 18/584,773, Sep. 11, 2024, 22 pgs.

* cited by examiner

SOLAR CELL, METHOD FOR MANUFACTURING SOLAR CELL, AND PHOTOVOLTAIC MODULE

CROSS REFERENCE TO RELATED APPLICATIONS

The present application claims the benefit of priority under the Paris Convention to Chinese Patent Application No. 202311330430.5 filed on Oct. 13, 2023, which is incorporated herein by reference in its entirety.

TECHNICAL FIELD

The various embodiments described in this document relate in general to the technical field of photovoltaic, and more specifically to a solar cell, a method for manufacturing the solar cell, and a photovoltaic module.

BACKGROUND

At present, with the gradual depletion of fossil energy, solar cells, as a new energy alternative, are widely used. The solar cell is a device that converts light energy of the sun into electric energy. The solar cell can generate carriers by the photovoltaic principle, and then use electrodes to lead out carriers, which is beneficial to the effective use of electric energy.

Current solar cells mainly include interdigitated back contact (IBC) cells, tunnel oxide passivated contact (TOPCON) cells, passivated emitter and real cell (PERC) cells, and heterojunction cells. The photoelectric conversion efficiency of the solar cell can be improved by reducing optical loss and photo-generated carrier recombination on the surface of a silicon substrate and inside the silicon substrate through different film arrangements and functional limitations.

However, the photoelectric conversion efficiency of the current solar cell is still poor.

SUMMARY

The embodiment of the disclosure provides a solar cell, a method for manufacturing the soler cell, and a photovoltaic module, which are at least beneficial to improving the photoelectric conversion efficiency of the solar cell.

According to a first aspect, embodiments of the disclosure provide a soler cell, including: a substrate having electrode regions and non-electrode regions that are alternatingly arranged in a first direction, where the non-electrode regions include first regions and second regions, where each respective second region of the second regions is disposed adjacent to a respective first region of the first regions; a dielectric layer formed over the electrode regions and the second regions; a doped conductive layer formed over the dielectric layer; a passivation layer formed over the first regions and the doped conductive layer; and a plurality of electrodes, where a respective electrode of the plurality of electrodes is formed over a respective electrode region of the plurality of electrode regions, and the plurality of electrodes penetrate the passivation layer to be in electrical contact with the doped conductive layer.

In some embodiments, the substrate has a first side and a second side opposite to the first side, where the respective first region has at least one groove recessed toward the second side, and the passivation layer is formed in the at least one groove.

In some embodiments, the respective first region includes a third region in which the at least one groove is located and a fourth region other than the third region, and the fourth region has surface roughness equal to or greater than surface roughness of the respective second region.

In some embodiments, a ratio of a total surface area of the third region of the respective first region to a total surface area of the fourth region of the respective first region ranges from 1:10 to 15:1.

In some embodiments, each of the at least one groove is in a shape of an inverted pyramid, an inverted prismatic table, an elliptical sphere, a cuboid, or a circular prismatic table.

In some embodiments, each of the at least one groove has a size in a range of 0.1 μm to 50 μm.

In some embodiments, each of the at least one groove has a depth ranging from 0.2 μm to 5 μm in a direction perpendicular to a surface of the substrate.

In some embodiments, a ratio of a total surface area of the first regions to a total surface area of the non-electrode regions ranges from 1:6 to 20:21.

In some embodiments, a ratio of a total surface area of the respective first region to a total surface area of the respective second region ranges from 1:2 to 20:1.

In some embodiments, the doped conductive layer has a first side surface facing the respective first region, and an angle between the first side surface and the surface of the respective second region is less than or equal to 90°.

In some embodiments, the first side surface includes a substantially flat surface or a concave-convex surface.

In some embodiments, at least one of a surface of the respective second region or a surface of the respective electrode region includes a substantially flat surface or a concave-convex surface.

In some embodiments, a material of the dielectric layer includes at least one of silicon oxide, silicon carbide, amorphous silicon, and microcrystalline silicon.

In some embodiments, the doped conductive layer includes a first doped conductive layer being doped with one of an N-type doping element and a P-type doping element and a second doped conductive layer being doped with another of the N-type doping element and the P-type doping element; and the first doped conductive layer and the second doped conductive layer are formed over the dielectric layer, and the plurality of electrodes include first electrodes and second electrodes that are alternatingly arranged, and where the first electrodes penetrate the passivation layer to be in electrical contact with the first doped conductive layer, and the second electrodes penetrate the passivation layer to be in electrical contact with the second doped conductive layer.

In some embodiments, the doped conductive layer includes a plurality of sub-doped conductive layers stacked in sequence in a direction away from the substrate, where there is an interface layer provided between two adjacent sub-doped conductive layers of the plurality of sub-doped conductive layers.

According to a second aspect, embodiments of the disclosure provide a method for manufacturing the solar cell described in any embodiment of the first aspect, including: providing the substrate having the electrode regions and the non-electrode regions that are alternatingly arranged in the first direction; forming the dielectric layer over the electrode regions and the second regions; forming the doped conductive layer over the dielectric layer; forming the passivation layer over the first regions and the doped conductive layer; and forming the plurality of electrodes.

In some embodiments, forming the dielectric layer, and forming the doped conductive layer include: forming an initial passivation film and a doped conductive film over the substrate; and performing a shaping treatment on the initial passivation film and the doped conductive film that are formed over the non-electrode regions, to remove a part of the initial passivation film and a part of the doped conductive film that correspond to a part of a respective non-electrode region of the non-electrode regions, where a part of the substrate not covered by the initial passivation film and the doped conductive film becomes the plurality of first regions, a remaining portion of the respective non-electrode region becomes a second region, a remaining portion of the initial passivation film becomes the dielectric layer, and a remaining portion of the doped conductive film becomes the doped conductive layer.

In some embodiments, the shaping treatment includes a wet etching process.

In some embodiments, in process parameters of the wet etching process, a reaction solution includes an acid solution, and a reaction time for the wet etching process includes 50 s to 550 s.

In some embodiments, the method further includes before performing the shaping treatment on the initial passivation film and the doped conductive film that are formed over the non-electrode regions: forming a mask layer over the electrode regions of the substrate.

According to a third aspect, embodiments of the disclosure provide a photovoltaic module, including: a plurality of cell strings, where each cell string of the plurality of cell strings is formed by connecting a plurality of solar cells, and each solar cell is the solar cell described in any of the embodiments of the first aspect of the disclosure or the solar cell prepared by any of the embodiments of the second aspect of the disclosure.

BRIEF DESCRIPTION OF THE DRAWINGS

One or more embodiments are illustrated by illustrations with reference to the corresponding drawings which do not constitute a limitation of the embodiments and the figures in the drawings do not constitute a limitation of scale unless specifically stated. In order to more clearly explain the technical solutions of the embodiments of the present disclosure or in the related technologies, the drawings required to be used in the embodiments will be briefly described below. It will be obvious that the drawings described below are only some embodiments of the present disclosure, and other drawings can be obtained from these drawings without creative effort for those of ordinary skill in the art.

DETAILED DESCRIPTION OF THE EMBODIMENTS

Figure 1:
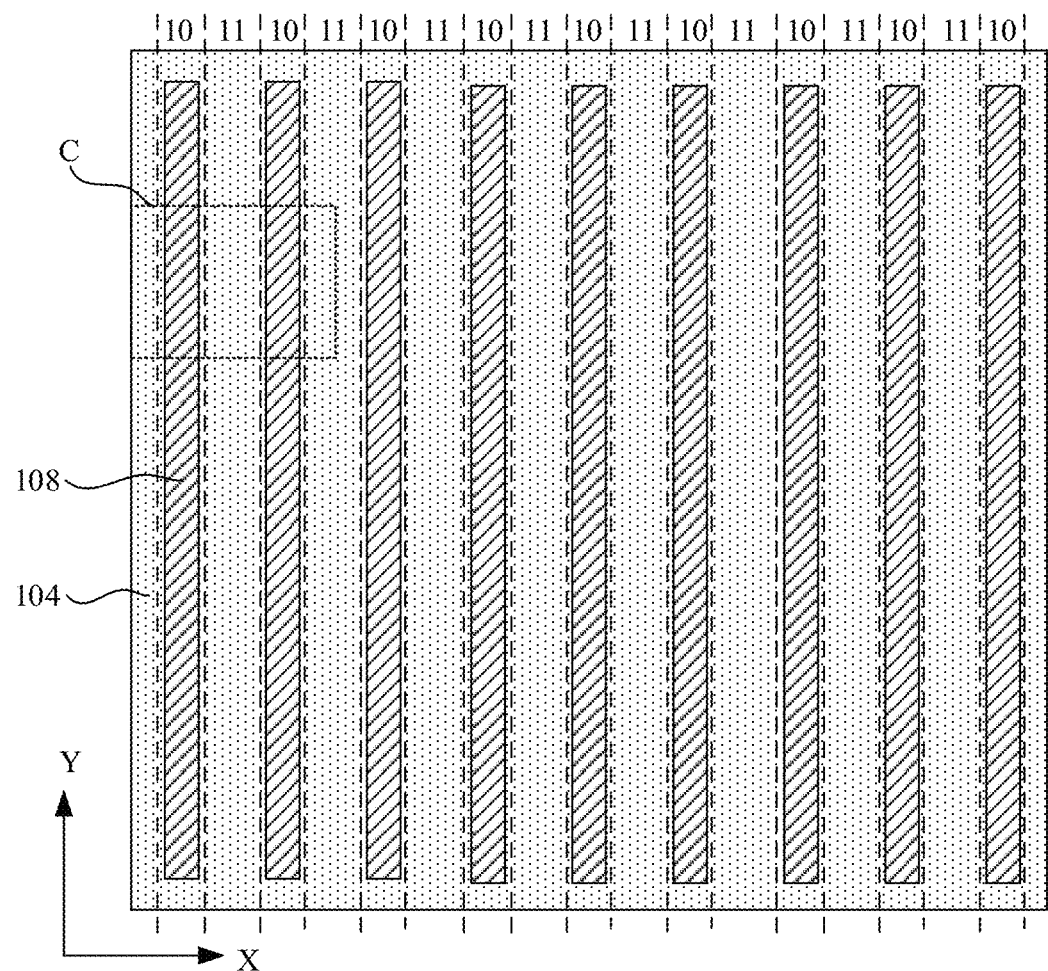
FIG. 1 is a schematic structural diagram of a solar cell according to a first embodiment of the present disclosure.

As can be seen from the background technology, the photoelectric conversion efficiency of the current solar cell is not good.

Embodiments of the disclosure provide a solar cell, a method for manufacturing the solar cell, and a photovoltaic module. The solar cell includes a substrate having electrode regions and non-electrode regions including first regions and second regions, where each respective second region of the second regions is disposed adjacent to a respective first region of the first regions. A dielectric layer is formed over the electrode regions and the second regions, and a passivation layer is formed over the first regions and the doped conductive layer. Compared with the conventional dielectric layer and the doped conductive layer that are formed over all the surface of the substrate, in the disclosure, since the first regions of the substrate are not covered by the dielectric layer and the doped conductive layer, the parasitic absorption of the doped conductive layer corresponding to the non-electrode regions can be reduced, the utilization rate of light can be improved, which is beneficial to improving the short-circuit current of the solar cell. Compared with the solutions in which no doped conductive layer is disposed over the non-electrode regions, the second regions are disposed adjacent to the first regions, so that the coverage area is reduced as much as possible on the premise of ensuring transversal transmission as much as possible, thereby ensuring low parasitic absorption, and thus achieving the purpose of improving this localized overall transversal transmission.

The embodiments of the disclosure will be described in detail below with reference to the accompanying drawings. However, those of ordinary skill in the art can understand that, in various embodiments of the disclosure, many technical details are set forth in order to provide the reader with a better understanding of the disclosure. However, the technical solutions claimed in the disclosure may be realized even without these technical details and various changes and modifications based on the following embodiments.

It is to be noted that in all the cross-sectional views of the solar cells in the drawings, in order to explain a relationship between a front surface and a back surface of the substrate, in all the cross-sectional views, an upper top surface of the solar cell is regarded as the front surface of the solar cell and a lower bottom surface of the soler cell is regarded as the back surface of the soler cell.

Figure 2:
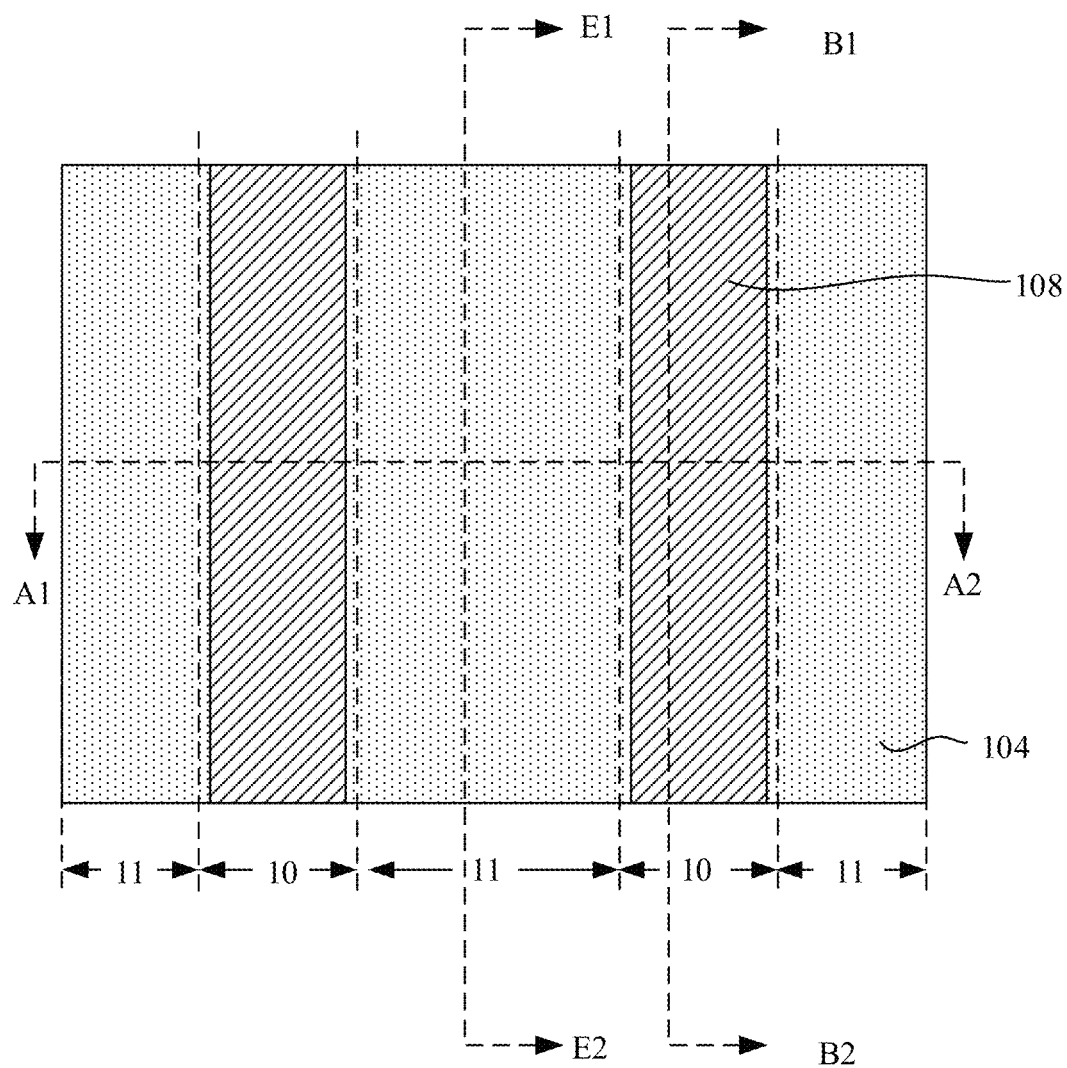
FIG. 2 is an enlarged partial view of part C of the solar cell in FIG. 1.
Figure 3:
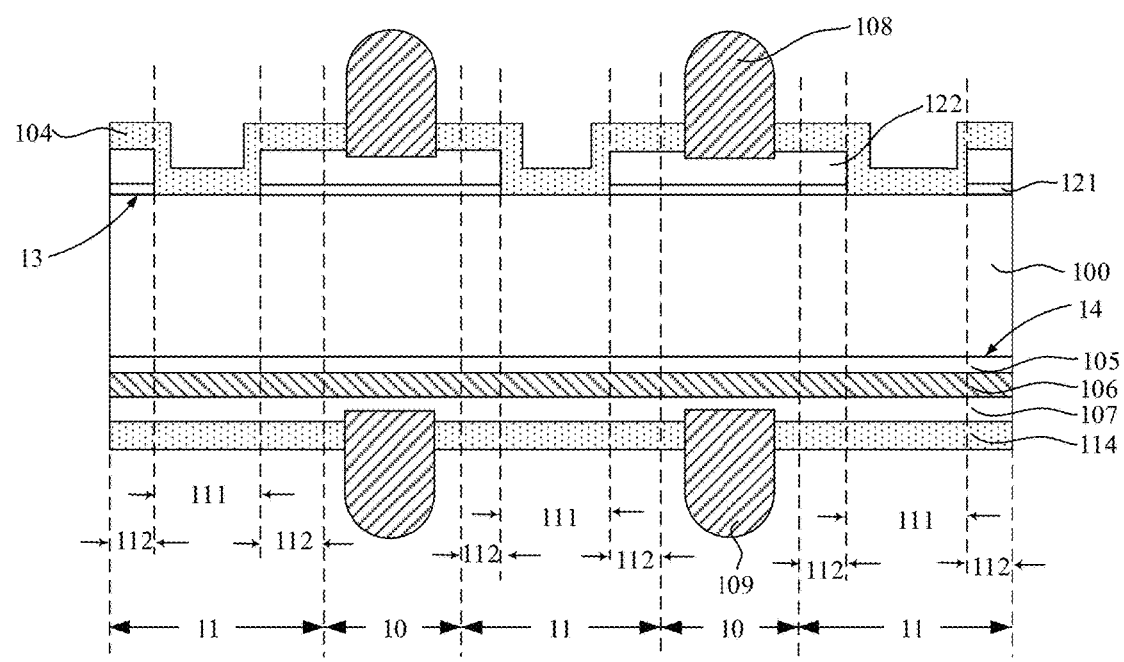
FIG. 3 is a first schematic cross-sectional structural view of FIG. 2 along section A1-A2.
Figure 4:
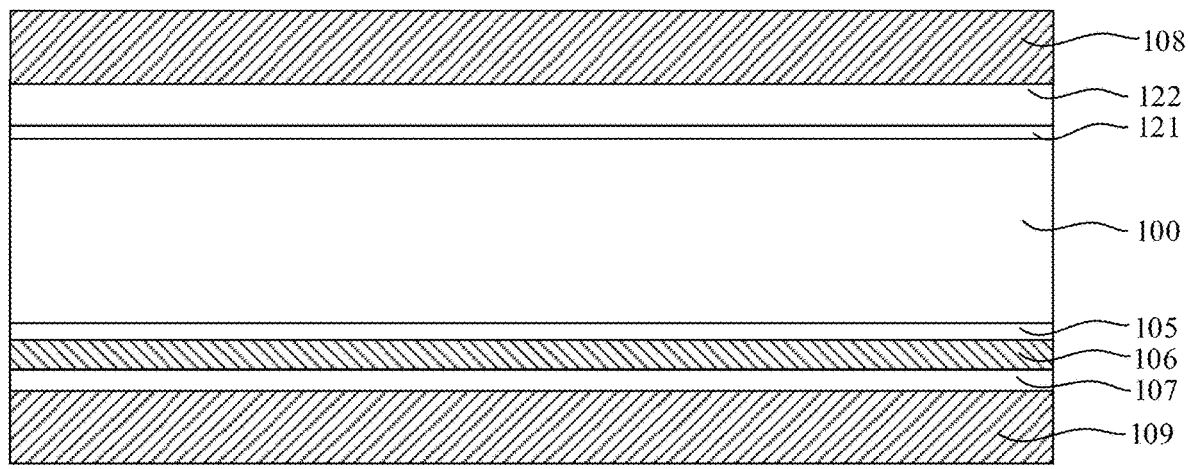
FIG. 4 is a first schematic cross-sectional structural view of FIG. 2 along section B1-B2.
Figure 5:
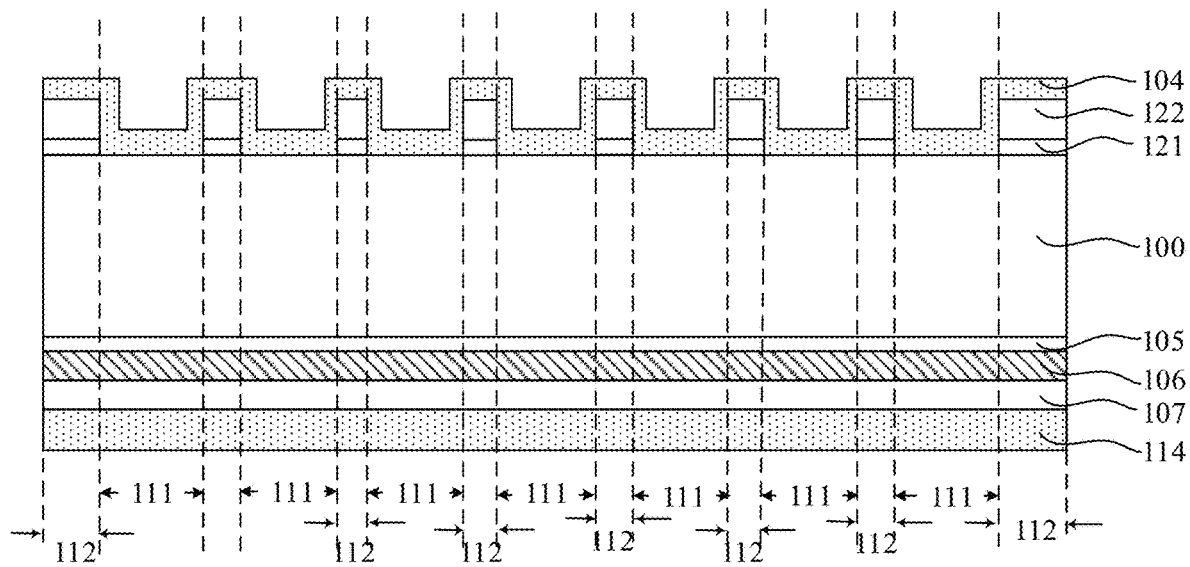
FIG. 5 is a first schematic cross-sectional structural view of FIG. 2 along section E1-E2.
Figure 6:
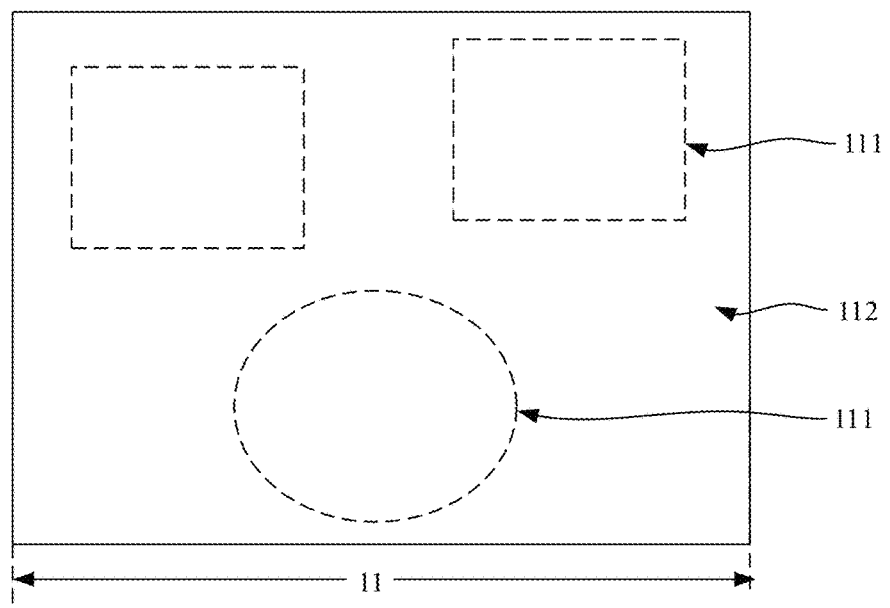
FIG. 6 is an enlarged partial view of a non-electrode region of the solar cell corresponding to FIGS. 3 to 5.

FIG. 1 is a schematic structural diagram of a solar cell according to a first embodiment of the present disclosure. FIG. 2 is an enlarged partial view of part C of the solar cell in FIG. 1. FIG. 3 is a first schematic cross-sectional structural view of FIG. 2 along section A1-A2. FIG. 4 is a first schematic cross-sectional structural view of FIG. 2 along section B1-B2. FIG. 5 is a first schematic cross-sectional structural view of FIG. 2 along section E1-E2. FIG. 6 is an enlarged partial view of a non-electrode region of the solar cell corresponding to FIGS. 3 to 5.

For illustration, merely one first region is illustrated in each non-electrode region of FIG. 3, but in an actual solar cell, a plurality of first regions may exist in a cross section along the A1-A2 direction. In other words, there may be one, two, three, or four first regions, or the like in each of the plurality of non-electrode regions.

Referring to FIG. 3, according to some embodiments of the present disclosure, the first embodiment of the present disclosure provides a solar cell. The solar cell includes a substrate 100 having a plurality of electrode regions 10 and a plurality of non-electrode region 11 that are alternatingly arranged in a first direction X.

In some embodiments, a material of the substrate 100 may be an elemental semiconductor material. Specifically, the elemental semiconductor material includes a single element, which can be germanium or silicon, for example. The elemental semiconductor material may be in a single crystal state, a polycrystalline state, an amorphous state, or a microcrystalline state (i.e., a state having both the single crystal state and the amorphous state). For example, the silicon may be at least one of single crystal silicon, polycrystalline silicon, amorphous silicon, and microcrystalline silicon.

In other embodiments, the material of the substrate 100 may be a compound semiconductor material. Common compound semiconductor materials include but are not limited to silicon germanium, silicon carbide, gallium arsenide, indium gallium, perovskite, cadmium telluride, copper indium selenium, and other materials. The substrate 100 may also be a sapphire substrate, a silicon-on-insulator substrate, or a germanium-on-insulator substrate.

In some embodiments, the substrate 100 may be an N-type semiconductor substrate or a P-type semiconductor substrate. The N-type semiconductor substrate is doped with a doping element of an N-type (N-type doping element), and the N-type doping element may be any one of Group-V elements, such as a phosphorus (P) element, a bismuth (Bi) element, an antimony (Sb) element, and an arsenic (As) element. The P-type semiconductor substrate is doped with a doping element of a P-type (P-type doping element), and the P-type doping element may be any one of Group-III elements, such as a boron (B) element, an aluminum (Al) element, a gallium (Ga) element, and an indium (In) element.

In some embodiments, each respective electrode region (i.e., metallization pattern region) 10 refers to a region within the substrate 100 directly facing a respective electrode 108 of a plurality of electrodes 108 in a thickness direction of the substrate 100 (in a direction perpendicular to a surface of the substrate), or can be understood as a region, of the substrate, corresponding to an orthographic projection of the respective electrode 108 on the substrate 100. In contrast, a region within the substrate 100 that does not directly face the plurality of electrodes 108 includes a plurality of non-electrode regions (non-metallization pattern region) 11. An area of the respective electrode region 10 is larger than or equal to an area of the orthographic projection of the respective electrode 108 on the substrate 100, such that regions of the substrate in contact with the electrodes 108 are all the electrode regions 10.

In other words, each respective electrode region is a region of the substrate corresponding to metallization pattern, and has a width larger than a width of the respective electrode in a crosse section of the solar cell. Accordingly, the non-electrode regions are regions of the substrate other than the metallization pattern regions.

It is to be noted that the electrode regions 10 and the non-electrode regions 11 in the above are defined for non-IBC cells. That is, in the above embodiments, conductive electrodes of two different polarities of the solar cell are respectively disposed over two opposite sides of the substrate 100, rather than on a same side of the substrate 100. When the solar cell is an IBC cell or conductive electrodes of two different polarities of the solar cell are disposed over the same side of the substrate 100, the electrode regions 10 refer to regions within the substrate directly facing conductive electrodes of one polarity and regions within the substrate directly facing conductive electrodes of another polarity (i.e., regions with the substrate directly facing the conductive electrodes of the two different polarities. The non-electrode regions 11 refer to regions within the substrate where none of the conductive electrodes of two different polarities are directly faced.

In some embodiments, the plurality of non-electrode regions 11 include a plurality of first regions 111 and a plurality of second regions 112, where each respective second region 112 is disposed adjacent to a respective first region 111 of the plurality of first regions 111. As shown in FIG. 6, there is no fixed positional relationship between the first region 111 and the second region 112, and the first region 111 and the second region are distinguished from each other by that there are no dielectric layer and doped conductive layer on the first region 111 and there are a dielectric layer and a doped conductive layer disposed on the second region 112. In other words, the positional relationship between the first region 111 and the second region 112 may be as shown in FIG. 6. The second region 112 is adjacent to the first region 111, and the second region 112 surrounds the first region 111 to increase the transmission path between the substrate and the electrodes, thereby improving the collection rate and the collection efficiency of the carriers.

In some embodiments, the second region 112 may be disposed over a side of the first region 111 and does not surround the first region 11. Alternatively, the second region 112 may partially surround the first region 111, which may also fall within the protection scope of embodiments of the present disclosure. Furthermore, the first region may be a rectangular surrounding region or an elliptical surrounding region as shown in FIG. 6. The first region may have any shape, and the shape of the first region is not limited to the pattern shown in FIG. 6.

In some embodiments, a ratio of a total surface area of the first regions 111 of the substrate 100 to a total surface area of the non-electrode regions 11 of the substrate 100 ranges from 1:6 to 20:21, for example, ranges from 1:6 to 1:5.3, 1:5.3 to 1:4.9, 1:4.9 to 1:4.3, 1:4.3 to 1:3.5, 1:3.5 to 1:2.8, 1:2.8 to 1:2.1, 1:2.1 to 1:1.6, 1:1.6 to 1:1.3, or 1:1.3 to 20:21. When the ratio of the total surface area of the first regions 111 to the total surface area of the non-electrode regions 11 is within any of the above-described ranges, a proportion of a part of the doped conductive layer on the non-electrode regions 11 is suitable. In this way, the parasitic absorption in the non-electrode regions 11 due to the large proportion of the doped conductive layer can be reduced, thereby reducing the optical absorption of the non-electrode regions 11. In addition, a transmission channel is established between doped conductive layers, to improve the transverse transmission capability between adjacent electrode regions 10, thereby improving the cell performance of the solar cell.

In some embodiments, for each respective non-electrode region 11 of the substrate 100, a ratio of a total surface area of the first region 111 of the respective non-electrode region 11 to a total surface area of the second region 112 of the respective non-electrode region 11 ranges from 1:2 to 20:1, for example, ranges from 1:2 to 1:1.3, 1:1.3 to 1.2:1, 1.2:1 to 2:1, 2:1 to 3.5:1, 3.5:1 to 5:1, 5:1 to 6.8:1, 6.8:1 to 11:1, 11:1 to 15:1, 15:1 to 18.3:1, or 18.3:1 to 20:1. By balancing the total surface area of the first region 111 of the respective non-electrode region 11 and the total surface area of the second region 112 of the respective non-electrode region 11 to balance the area of the doped conductive layer on the respective non-electrode region 11, the parasitic absorption of the doped conductive layer on the non-electrode regions 11 can be reduced and the transverse transmission capability of the cell can be improved through the doped conductive layers, thereby improving the photoelectric conversion efficiency of the solar cell.

Figure 7:
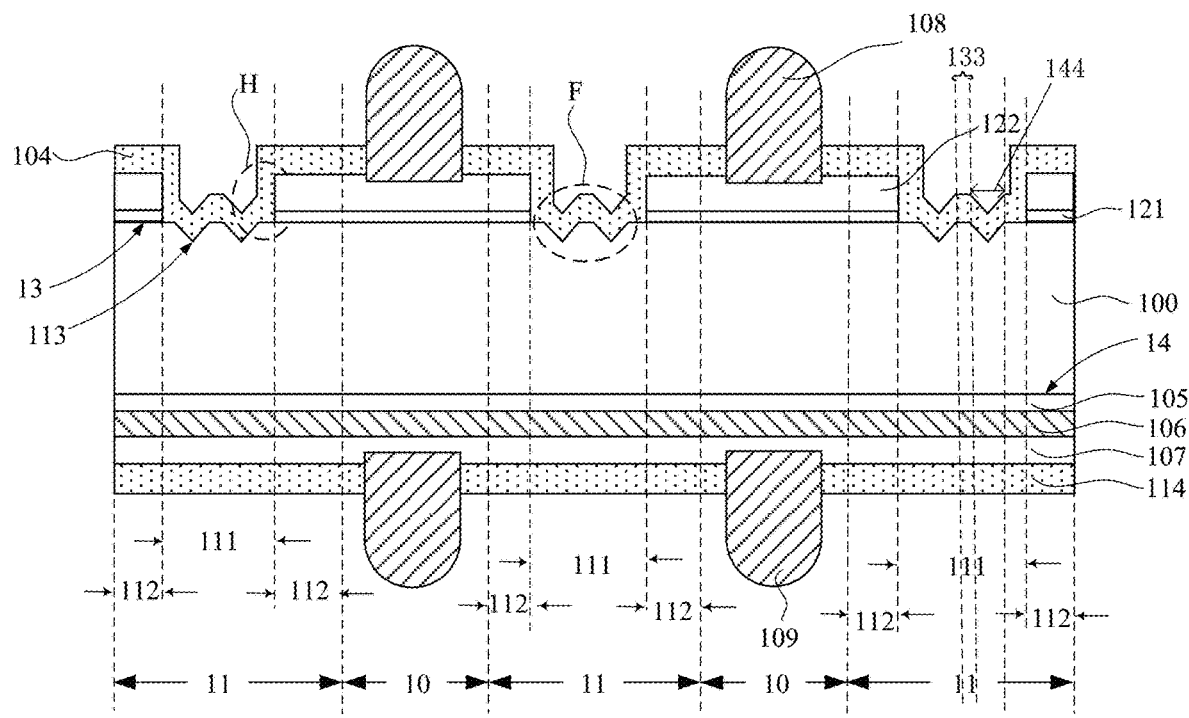
FIG. 7 is a second schematic cross-sectional structural view of FIG. 2 along section A1-A2.
Figure 8:
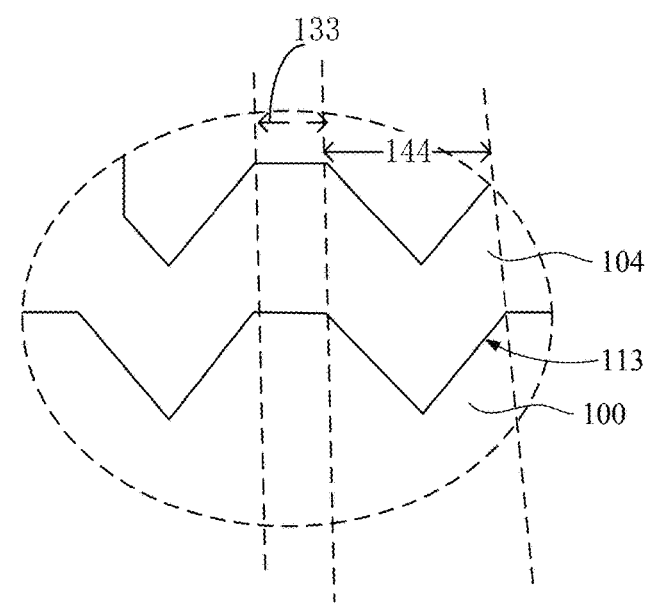
FIG. 8 is an enlarged partial view of part F in FIG. 7.
Figure 9:
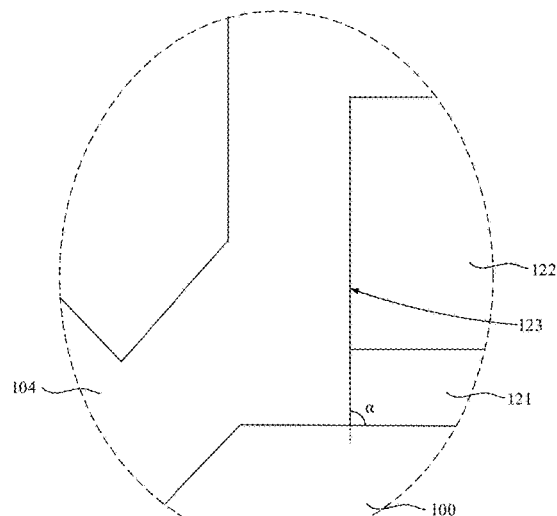
FIG. 9 is an enlarged partial view of part H in FIG. 7.
Figure 10:
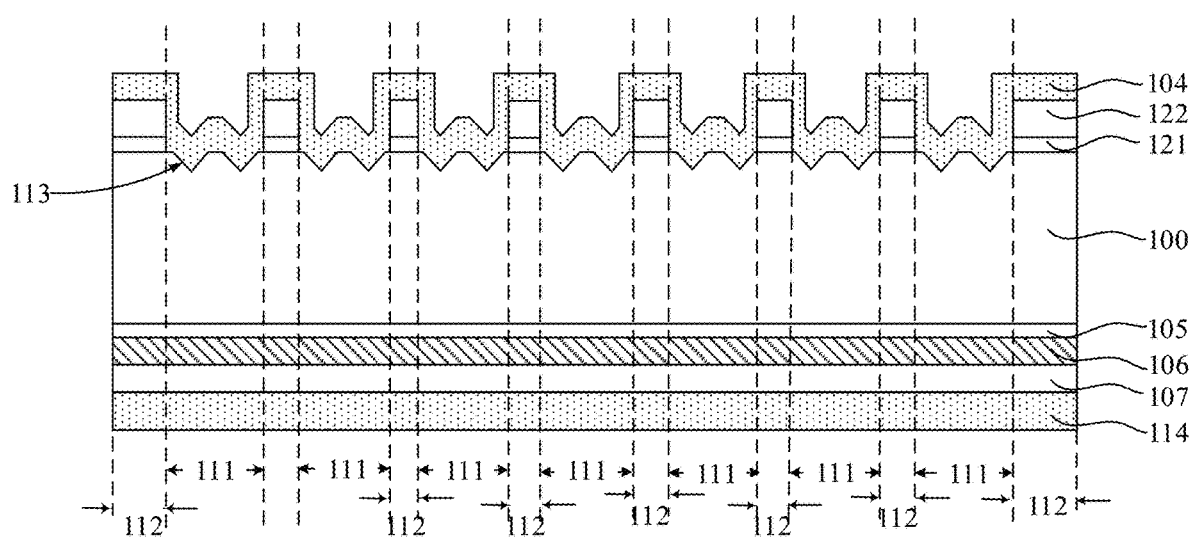
FIG. 10 is a second schematic cross-sectional structural view of FIG. 2 along section E1-E2.
Figure 11:
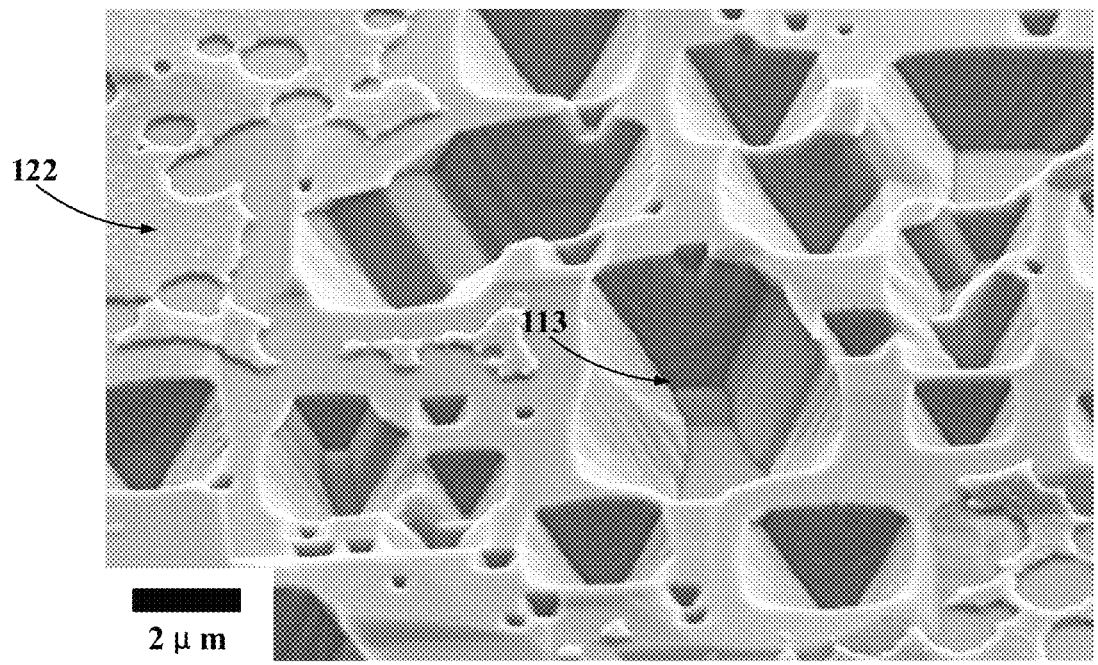
FIG. 11 is a first scanning electron microscope view of non-electrode regions of the substrate of the solar cell according to an embodiment of the present disclosure.
Figure 12:
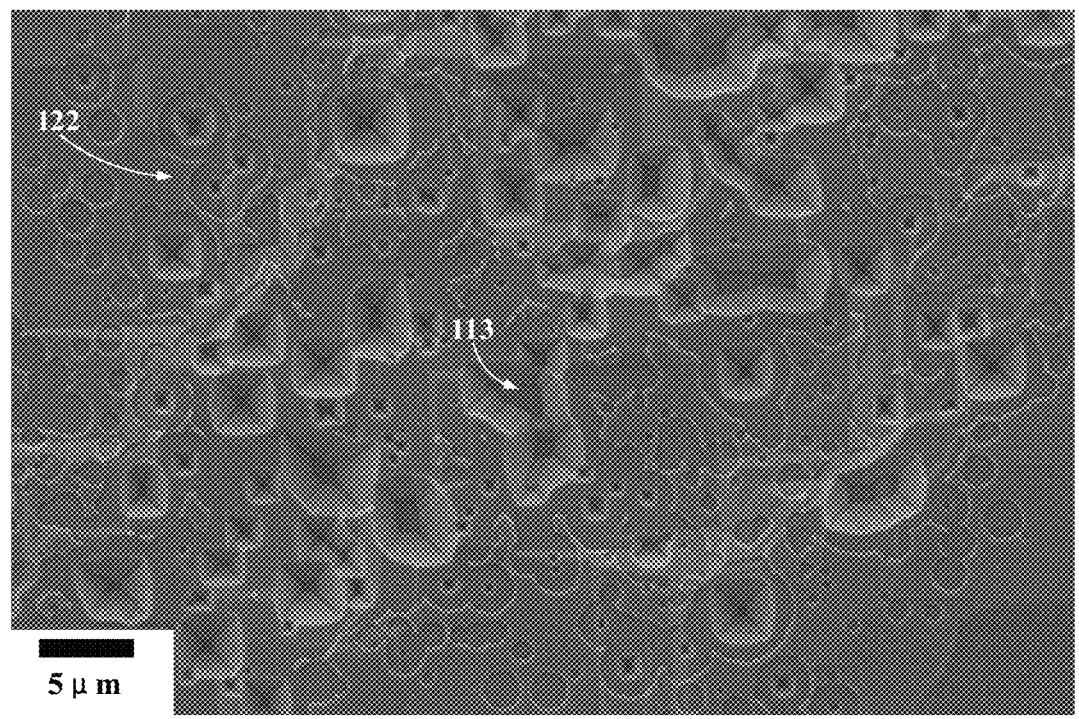
FIG. 12 is a second scanning electron microscope view of the non-electrode regions of the substrate of the solar cell according to an embodiment of the present disclosure.

FIG. 7 is a second schematic cross-sectional structural view of FIG. 2 along section A1-A2. FIG. 8 is an enlarged partial view of part F in FIG. 7. FIG. 9 is an enlarged partial view of part H in FIG. 7. FIG. 10 is a second schematic cross-sectional structural view of FIG. 2 along section E1-E2. FIG. 11 is a first scanning electron microscope view of the non-electrode regions of the substrate of the solar cell according to an embodiment of the present disclosure. FIG. 12 is a second scanning electron microscope view of the non-electrode regions of the substrate of the solar cell according to an embodiment of the present disclosure. The second schematic cross-sectional structural view of the solar cell along section B1-B2 corresponding to FIG. 7 is the same as FIG. 4.

In some embodiments, referring to FIG. 7, each first region 111 of the substrate 100 has at least one groove 113 recessed toward the second side 14 in a direction from a first side 13 to a second side 14. The groove 113 can improve the internal reflection of the incident light and enhance the capture and utilization of the incident light, thereby improving the utilization rate of the incident light, reducing the optical loss and facilitating the formation of a back reflection structure, and thus enhancing the short-circuit current of the solar cell device and improving the photoelectric conversion efficiency.

When the ratio of the total surface area of the first regions 111 to the total surface area of the non-electrode regions 11 ranges from 1:6 to 20:21 (i.e., a ratio of a total area of a part of a surface of the substrate corresponding to the first regions to a total area of another part of the surface of the substrate corresponding to the non-electrode regions ranges from 1:6 to 20:21), the number and proportion of the grooves 113 are appropriate, thereby improving the capture of the incident light by the solar cell and improving the photoelectric conversion efficiency of the solar cell.

In addition, compared with the conventional textured structure including regular pyramid structures, since the grooves 113 are recessed toward an inner side of the substrate 100, the solar cell can capture more incident light, thereby having better optical performance. Moreover, due to the large size of the regular pyramid structure, it is easy to generate steps between the regular pyramid structures with different crystal orientations, which may lead to electric leakage. On the contrary, the groove 113 is simple in the preparation process, and there is no leakage current in crystal orientations, which may cause the solar cell to have good electrical properties.

In some embodiments, with reference to FIG. 7, each groove 113 may be in a shape of an inverted pyramid, an inverted prismatic table, an elliptical sphere, a cuboid, or a circular prismatic table. As an example, the groove in FIG. 7 is in the shape of the inverted pyramid. There is no restriction on the shape of the groove, and the groove may have any of the above-mentioned shapes.

In some embodiments, each groove 113 has a size in a range of 0.1 μm to 50 μm. For example, the size of the groove 113 is in a range of 0.1 μm to 0.8 μm, 0.8 μm to 2.1 μm, 2.1 μm to 5.6 μm, 5.6 μm to 7.3 μm, 7.3 μm to 9.3 μm, 9.3 μm to 28.9 μm, 28.9 μm to 38.8 μm, 38.8 μm to 44.3 μm, or 44.3 μm to 50 μm. When the size of the groove 113 is within any of the above-described ranges, a certain space region can be formed for capturing and utilizing the incident light, and the preparation process for forming the groove 113 is less difficult, thereby avoiding large damage to the first side 13 of the substrate 100, and thus reducing defects on the first side 13.

In some embodiments, each groove 113 has a depth ranging from 0.2 μm to 5 μm in the direction perpendicular to a surface of the substrate. For example, the groove 113 has the depth ranging from 0.2 μm to 0.9 μm, 0.9 μm to 1.6 μm, 1.6 μm to 2.6 μm, 2.6 μm to 3.3 μm, 3.3 μm to 4.1 μm, 4.1 μm to 4.6 μm, or 4.6 μm to 5 μm. When the depth of the groove 113 is within any of the above-described ranges, the utilization rate and the internal reflectivity of the incident light can be improved, thereby improving the photoelectric conversion efficiency of the solar cell. The range of the depth of the groove 113 can also ensure that the thickness of the passivation layer deposited therein is relatively appropriate, thereby forming a good passivation effect on the surface of the substrate 100 and reducing the recombination defects of the substrate 100.

In addition, the range of the depth of the groove 113 may ensure that a height difference between the groove 113 and a surface of the second region 112 of the substrate 100 is relatively small, thereby having lower steps and avoiding leakage current problems caused by the steps, and thus improving the electrical properties of the substrate 100.

The size of the groove 113 refers to an average value of one-dimensional bottom sizes of grooves 113 within any region of the surface of the substrate 100, where each one-dimensional bottom size is a one-dimensional size of a bottom surface of a respective groove 113 of the grooves 113. It can be understood that the range of the size of the groove 113 refers to a range of an average value of sizes of the grooves 113 within one region (i.e., average one-dimensional size), rather than all ranges of sizes of all grooves 113 within the substrate 100. All the ranges of the sizes of all the grooves 113 within the substrate 100 are generally larger than the range of the average value of the sizes of the grooves 113 within the one region. For illustration, the grooves 113 in FIG. 7 have a substantially same morphology and the size of each groove 113 is equal to the average one-dimensional size.

It is to be noted that the one-dimensional size refers to a distance between two diagonal corners of the groove 113. In some embodiments, the one-dimensional size may also refer to a distance between two opposing sides of the groove 113. The depth of the groove 113 refers to a vertical distance between a vertex of the groove 113 near the second side 14 and a side surface of the groove 113 away from the second side 14 in the direction from the first side 13 to the second side 14.

In some embodiments, referring to FIG. 8, the respective first region includes a third region 144 in which the at least one groove 113 is located and a fourth region 133 other than the third region 144. The passivation layer is also formed over the fourth region 133.

In some embodiments, the fourth region 133 has surface roughness equal to or greater than surface roughness of the respective second region. When the surface roughness of the fourth region 133 is greater than the surface roughness of the second region, the passivation layer formed later may be covered on the fourth region 133 to improve the passivation effect of the fourth region 133, so as to improve surface recombination defects of the substrate 100. A dielectric layer and a doped conductive layer are deposited on the second regions. If the surface roughness of the second regions is low, i.e., the surface of the second regions has high flatness, the performance of the dielectric layer and the doped conductive layer deposited over the second regions is relatively good. For example, the compactness of the dielectric layer and the doped conductive layer deposited on the second regions is good, thereby forming a good tunneling passivation effect on the substrate 100, effectively preventing the migration of minority carriers and promoting the migration of multiple carriers, and increasing the migration rate of the carriers.

It is to be noted that the reason for the difference between the surface roughness of the fourth region 133 and the surface roughness of the second region is that a height of a texture structure of the fourth region 133 is greater than a height of a texture structure of the second region or a degree of concavity and convexity (e.g., degree of unevenness) of the fourth region 133 is greater than a degree of unevenness of the second region. The surface roughness refers to an arithmetic mean of absolute values of vertical deviations (height differences in a vertical direction) of points, in a sample length of the surface, relative to a reference horizontal line. The roughness can be measured by the comparison method, the light cutting method, the interference method, and the needle tracing method.

In some embodiments, a ratio of a total surface area of the third region 144 of each respective first region to a total surface area of the fourth region 133 of the respective first region ranges from 1:10 to 15:1. For example, the ratio of the total surface area of the third region 144 of the respective first region to the total surface area of the fourth region 133 of the respective first region ranges from 1:10 to 1:5.8, 1:5.8 to 1:1.9, 1:1.9 to 1:1, 1:1 to 2:1, 2:1 to 3.5:1, 3.5:1 to 5:1, 5:1 to 6.8:1, 6.8:1 to 10:1, 10:1 to 13.1:1, or 13:1 to 15:1. By defining the total surface area of the third region 144 of the respective first region and the total surface area of the fourth region 133 of the respective first region, the surface area of the fourth region 133 can be reduced to improve the passivation effect of the solar cell. The total surface area of the third regions 144 is relatively larger, so that the utilization rate of the incident light can be improved, thereby improving the cell efficiency.

In some embodiments, at least one of a surface of the respective second region or a surface of the respective electrode region includes a substantially flat surface or a concave-convex surface. The flat surface includes a polished surface.

It shall be understood that the polished surface refers to a flat surface formed by removing a textured structure of the surface through polishing solution or laser etching. After polishing, the flatness of the surface of the substrate 100 is increased, the reflection to long-wave light is increased, and the secondary absorption of projected light is promoted, thereby improving the short-circuit current. In addition, since a specific surface area of the surface of the substrate 100 is reduced, the surface recombination of the substrate 100 is reduced, and the surface passivation effect of the substrate 100 can be improved.

In some cases, the flat surface refers to a relatively flat surface, not an absolutely flat surface. Generally, a surface with roughness less than or equal to 5 μm and greater than or equal to −5 μm is characterized as a flat surface. In addition, a surface with roughness less than roughness of the concave-convex surface can also be called a flat surface.

In some embodiments, the substrate 100 has the first side 13 and the second side 14 opposite to the first side 13.

In some embodiments, the first side 13 of the substrate 100 may include a front surface and the second side 14 of the substrate 100 may include a back surface, or the first side 13 may include a back surface and the second side 14 may include a front surface. That is, if the solar cell is a single-sided cell, the front surface may be a light receiving surface for receiving incident light, and the back surface may be a backlight surface. In some embodiments, if the solar cell is a double-sided cell, i.e., both the first side 13 and the second side 14 of the substrate 100 can be used as light receiving surfaces for receiving the incident light.

In the solar cells shown in FIGS. 3 and 7, the first side of the substrate includes the front surface, and the second side of the substrate includes the back surface. That is, in the above embodiments of the disclosure, components formed over the front surface of the solar cell are improved to reduce parasitic absorption on the front surface of the solar cell.

In some embodiments, referring to FIG. 3, the solar cell further includes a dielectric layer 121 formed over the electrode regions 10 and the second regions 112, and a doped conductive layer 122 formed over the dielectric layer 121.

In some embodiments, a material of the dielectric layer 121 includes at least one of silicon oxide, silicon carbide, amorphous silicon, microcrystalline silicon, and the like.

In some embodiments, the dielectric layer 121 may include a tunneling dielectric layer, so that the tunneling dielectric layer and the doped conductive layer 122 form a passivation contact structure. The doped conductive layer 122 can form an energy band bending on the surface of the substrate 100. The tunneling dielectric layer causes an asymmetric shift of the energy band on the surface of the substrate 100, so that the barrier for majority carriers in the carriers is lower than the barrier for minority carriers in the carriers. Therefore, the majority carriers can easily pass through the tunneling dielectric layer through quantum tunneling, and the minority carriers are difficult to pass through the tunneling dielectric layer, such that selective transport of the carriers can be achieved.

In addition, the dielectric layer has the effect of chemical passivation. Specifically, due to the existence of interface state defects at the interface between the substrate 100 and the tunneling dielectric layer, the interface state density on the back surface of the substrate 100 is large, and the increase of the interface state density may promote the recombination of photo-generated carriers, and increase the filling factor, short-circuit current, and open-circuit voltage of the solar cell, to improve the photoelectric conversion efficiency of the solar cell. The tunneling dielectric layer is arranged on the first side 13 of the substrate 100, so that the tunneling dielectric layer has the effect of chemical passivation on the surface of the substrate 100. Specifically, the carrier recombination rate is reduced by saturating the hanging bonds of the substrate 100, reducing the interface state density of the substrate 100, and reducing the recombination center of the substrate 100.

In some embodiments, the material of the tunneling dielectric layer may include at least one of silicon oxide, silicon nitride, silicon oxynitride, silicon carbide, and magnesium fluoride, and the like.

The doped conductive layer 122 has a field passivation effect. Specifically, an electrostatic field directed to the inside of the substrate 100 is formed over the surface of the substrate 100, so that the minority carriers escape from the interface, thereby reducing the concentration of the minority carriers and reducing the carrier recombination rate at the interface of the substrate 100. Therefore, the open-circuit voltage, the short-circuit current, and the filling factor of the solar cell can be increased and thus, the photoelectric conversion efficiency of the solar cell can be improved.

A material of the doped conductive layer 122 may include at least one of amorphous silicon, polysilicon, and silicon carbide.

The doped conductive layer 122 may be doped with doping elements of a same type as the substrate 100. For example, if the substrate 100 is doped with a P-type doping element, the doped conductive layer 122 may also be doped with the P-type doping element. If the substrate 100 is doped with an N-type doping element, the doped conductive layer 122 may also be doped with the N-type doping element.

In some embodiments, concentration of a doping element within the doped conductive layer 122 is greater than concentration of a doping element of the substrate 100, to form a sufficiently high potential barrier on the back surface of the substrate 100, so that the majority carriers in the substrate 100 can pass through the tunneling dielectric layer to reach the doped conductive layer 122.

In some embodiments, a thickness of the tunneling dielectric layer in the direction perpendicular to the surface of the substrate is in a range of 0.5 nm to 5 nm. For example, the thickness of the tunneling dielectric layer ranges from 0.5 nm to 1.3 nm, 1.3 nm to 2.6 nm, 2.6 nm to 4.1 nm, or 4.1 nm to 5 nm. If the tunneling dielectric layer is within any of the above-described ranges, the dielectric layer is relatively thin, the majority carriers can easily pass through the dielectric layer through quantum tunneling, and the minority carriers are difficult to pass through the tunneling dielectric layer, such that selective transport of the carriers can be achieved.

In some embodiments, the dielectric layer 121 may include an intrinsic dielectric layer, and the intrinsic dielectric layer and the substrate form a heterojunction structure. The intrinsic dielectric layer may have a good passivation effect on the surface of the substrate, which may greatly avoid carrier recombination, improve lifetime of the minority carriers, and improve the open-circuit voltage.

In some embodiments, a material of the intrinsic dielectric layer includes intrinsic amorphous silicon, intrinsic microcrystalline silicon, intrinsic silicon oxide, intrinsic silicon nitride nanocrystalline silicon, or intrinsic silicon carbide. A thickness of the intrinsic dielectric layer may be in a range of greater than or equal to 2 microns (μm) and less than or equal to 10 μm, and preferably 5 km. In some cases, the intrinsic dielectric layer may also include a small amount of doping elements due to the diffusion of other films prepared later or the influence of doping process conditions.

In some embodiments, the doped conductive layer includes a composite thin film layer formed by one or more semiconductor thin films of N-type or P-type doped amorphous silicon, amorphous silicon oxide, amorphous silicon carbide, microcrystalline silicon, hydrogenated microcrystalline silicon, microcrystalline silicon oxide, microcrystalline silicon carbide, or polysilicon. The thickness of the doped conductive layer ranges from 4 nm to 30 nm in the direction perpendicular to the surface of the substrate.

The use of the hydrogenated microcrystalline silicon can have a relatively large band gap and a relatively narrow absorption spectrum range, so that the photoelectric conversion efficiency of the cell can be effectively improved. With the increase of crystallization rate, the series resistance decreases and the filling factor increases, such that the output current of the cell can be improved and the lifetime of the cell can be effectively prolonged.

In some embodiments, the solar cell further includes a first transparent conductive layer positioned on a surface of the doped conductive layer away from the substrate. The first transparent conductive layer may include at least one of tin-doped indium oxide (ITO), aluminum-doped zinc oxide (AZO), cerium-doped indium oxide, and tungsten-doped indium oxide.

In some embodiments, referring to FIG. 9, in a direction from each second region 112 to a respective first region 111, a side surface of the doped conductive layer 122 facing the respective first region 111 is a first side surface 123, and an angle between the first side surface 123 and the surface of the respective second region is less than or equal to 90°. Therefore, the first side surface 123 may serve as an inclined surface to improve the internal reflectivity of the incident light, thereby improving the photoelectric conversion efficiency of the solar cell. The first side surface 123 also facilitates increasing deposition of the passivation layer, so that the passivation layer deposited over the first regions is denser, thereby forming a good passivation effect on the substrate 100.

In some embodiments, the first side surface 123 includes a substantially flat surface or a concave-convex surface.

In some embodiments, a surface of the doped conductive layer 122 away from the dielectric layer 121 includes a flat surface.

In some embodiments, the solar cell further includes a passivation layer 104. The passivation layer 104 is formed over the first regions and the surface of the doped conductive layer 122 away from the substrate. The passivation layer is formed in the grooves 113.

When the solar cell includes the first transparent conductive layer, the passivation layer is formed over a surface of the first transparent conductive layer away from the substrate.

In some embodiments, the passivation layer 104 may be a single-layer structure or a stacked structure, and a material of the passivation layer 104 may be one or more of materials such as silicon oxide, silicon nitride, silicon oxynitride, silicon carbonitride, titanium oxide, hafnium oxide, and aluminum oxide.

In some embodiments, the solar cell includes a plurality of electrodes 108 arranged sequentially in the first direction X. Each respective electrode 108 of the plurality of electrodes 108 is formed over a respective electrode region 10. The plurality of electrodes 108 burn through (i.e., penetrate) the passivation layer 104 to be in electrical contact with the doped conductive layer 122.

When the solar cell includes the first transparent conductive layer, the plurality of electrodes 108 penetrate the passivation layer to be in contact with the first transparent conductive layer.

In some embodiments, a distance between adjacent electrodes 108 in the first direction X ranges from 0.5 mm to 2 mm. For example, the distance between the adjacent electrodes 108 in the first direction X ranges from 0.5 mm to 0.8 mm, 0.8 mm to 1.15 mm, 1.15 mm to 1.28 mm, 1.28 mm to 1.46 mm, 1.46 mm to 1.68 mm, 1.68 mm to 1.84 mm, or 1.84 mm to 2 mm.

In some embodiments, a width of each electrode 108 in the first direction X ranges from 5 μm to 50 μm. The width of the electrode 108 in the first direction X ranges from 5 μm to 9 μm, 9 μm to 14 μm, 14 μm to 23 μm, 23 μm to 34 μm, 34 μm to 42 μm, 42 μm to 45 μm, 45 μm to 48 μm, or 48 μm to 50 μm.

In some embodiments, the electrode 108 may be sintered from a burn-through paste. The electrode 108 may be formed by printing a metal paste on a portion of a surface of the passivation layer 104 or an anti-reflection layer using a screen-printing process. The metal paste may include at least one of silver, aluminum, copper, tin, gold, lead, and nickel. The metal paste is subjected to a sintering process. In some embodiments, the metal paste contains a material with a highly corrosive component such as glass powder, such that in the sintering process, the corrosive component may corrode the passivation layer 104 or the anti-reflection layer, so that the metal paste permeates the passivation layer 104 or the anti-reflection layer to make electrical contact with the doped conductive layer 122.

In some embodiments, with continued reference to FIG. 3, the solar cell further includes a first passivation layer 105 positioned on the second side 14, and a third doped conductive layer 106 formed over a side of the first passivation layer 105 away from the substrate 100. The doped conductive layer 122 is doped with one of the N-type doping element and the P-type doping element, and the third doped conductive layer 106 is doped with the other of the N-type doping element and the P-type doping element.

In some embodiments, the first passivation layer 105 is an intrinsic passivation layer, and the intrinsic passivation layer and the substrate 100 form a heterojunction structure. The heterojunction structure can make an interface between the intrinsic passivation layer and the substrate 100 form a relatively high open-circuit voltage and achieve a good passivation effect, so that the conversion efficiency can be further improved.

In some embodiments, the solar cell further includes a second transparent conductive layer 107 and a second passivation layer 114 that are sequentially stacked in a direction away from the substrate, and a plurality of third electrodes 109. The second transparent conductive layer 107 is positioned on a surface of the third doped conductive layer 106. The plurality of third electrodes 109 are in electrical contact with the second transparent conductive layer 107 after penetrating the second passivation layer 114.

In some embodiments, a material of the first passivation layer 105 includes at least one of intrinsic amorphous silicon, intrinsic microcrystalline silicon, intrinsic silicon oxide, intrinsic nanocrystalline silicon, and intrinsic silicon carbide. A thickness of the first passivation layer 105 is optionally in a range of greater than or equal to 2 μm and less than or equal to 10 μm, and preferably 5 μm. In some cases, the first passivation layer 105 may also include a small amount of doping elements due to the diffusion of other films prepared later or the influence of doping process conditions.

In some embodiments, the third doped conductive layer 106 includes a composite thin film layer formed by one or more semiconductor thin films of N-type doped or P-type doped amorphous silicon, amorphous silicon oxide, amorphous silicon carbide, microcrystalline silicon, hydrogenated microcrystalline silicon, microcrystalline silicon oxide, microcrystalline silicon carbide, or polysilicon. The thickness of the third doped conductive layer 106 ranges from 4 nm to 30 nm.

In some embodiments, the second transparent conductive layer 107 may include at least one of ITO, AZO, cerium-doped indium oxide, tungsten-doped indium oxide, and the like.

In some embodiments, a PN junction is formed between the third doped conductive layer 106 and the substrate 100. The first passivation layer 105 is inserted between the PN junction as a buffer layer, and the first passivation layer 105 has a good passivation effect on the surface of the substrate 100, which can greatly avoid the recombination of the carriers and improve lifetime of the minority carriers and the open-circuit voltage.

For the solar cell shown in FIG. 3, in some embodiments, the substrate 100 is doped with one of the N-type doping element and the P-type doping element, and the doped conductive layer 122 is doped with the other of the N-type doping element and the P-type doping element. Therefore, a PN junction is formed between the substrate 100 and the doped conductive layer 122, and new electron hole-electron pairs are formed after the sun irradiating the PN junction. Under the action of an electric field built in the PN junction, the photo-generated holes flow to a P region, the photo-generated electrons flow to a N region, and an electric current is generated after the circuit is turned on. For example, if the substrate 100 is doped with the N-type doping element, the substrate 100 serve as a N region, and the doped conductive layer 122 is doped with the P-type doping element, the doped conductive layer 122 serve as a P region. The P-type semiconductor has a hole (P-type semiconductor lacks a negatively charged electron, which can be regarded as an extra positive charge), and the N-type semiconductor has an additional free electron. A potential difference between the P-type semiconductor and the N-type semiconductor to generate electricity. Therefore, when sunlight irradiates the solar cell, light can excite electrons in silicon atoms (photoelectric effect), resulting in convection of electrons and holes. These electrons and holes may be affected by built-in potentials and gather in the N region and the P region respectively. In this case, the exterior of the solar cell is connected by electrodes to form a loop, thus generating current.

In some embodiments, a doping element within the substrate 100 and a doping element within the doped conductive layer 122 have a same conductivity type. A passivation contact structure and a high-low junction are formed between the substrate 100 and the doped conductive layer 122, so that the carriers in the substrate 100 migrate to the doped conductive layer 122 under the action of the built-in electric field, and then are absorbed by the electrodes 108, which is beneficial to improving the cell efficiency. A PN junction is formed between the third doped conductive layer 106 and the substrate 100.

In the solar cell provided in the embodiments of the present disclosure, each non-electrode region 11 includes the first region 111 and the second region 112 disposed adjacent to the first region 111, the dielectric layer 121 formed over the electrode regions and the second regions, and the passivation layer 104 is formed over the first regions and the doped conductive layer 122. Compared with the conventional dielectric layer and the doped conductive layer that cover all the surface of the substrate, in the embodiments of the disclosure, the first region 111 of the substrate which is not covered by the dielectric layer 121 and the doped conductive layer 122, thereby reducing the parasitic absorption of the doped conductive layer 122 corresponding to the non-electrode regions 11, improving the utilization rate of light, and thus improving the short-circuit current of the solar cell. Compared with the solution in which no doped conductive layer is disposed over the non-electrode regions, in embodiments of the disclosure, each second region 112 is disposed adjacent to the respective first region 111, so that the coverage area is reduced as much as possible while ensuring the transversal transmission as much as possible, so as to ensure low parasitic absorption and improve localized overall transversal transmission.

Figure 13:
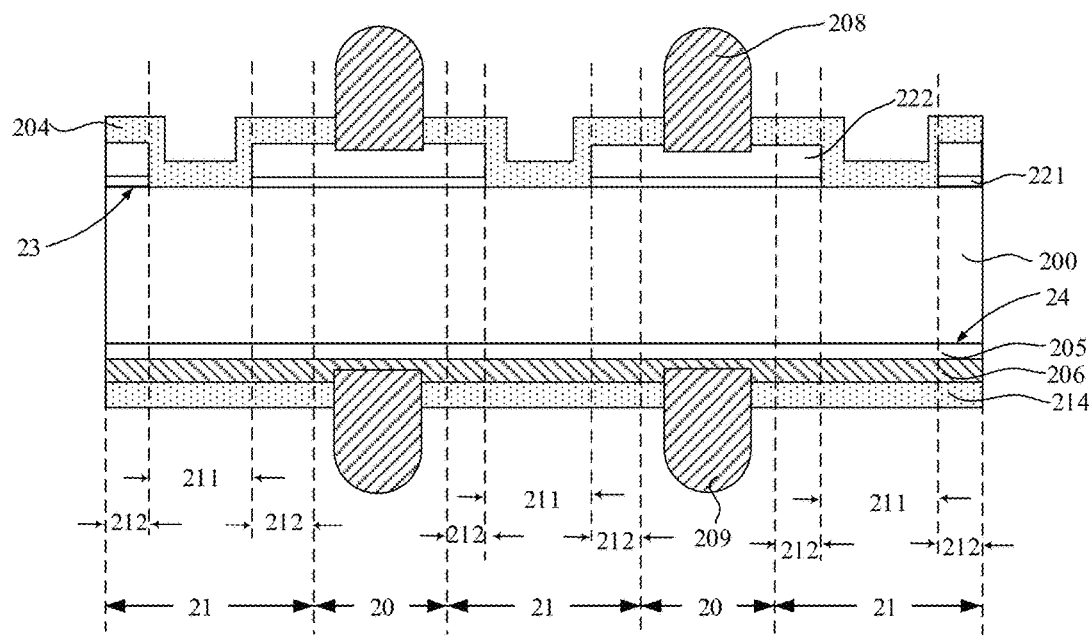
FIG. 13 is a first schematic cross-sectional structural view of a solar cell according to a second embodiment of the present disclosure.
Figure 14:
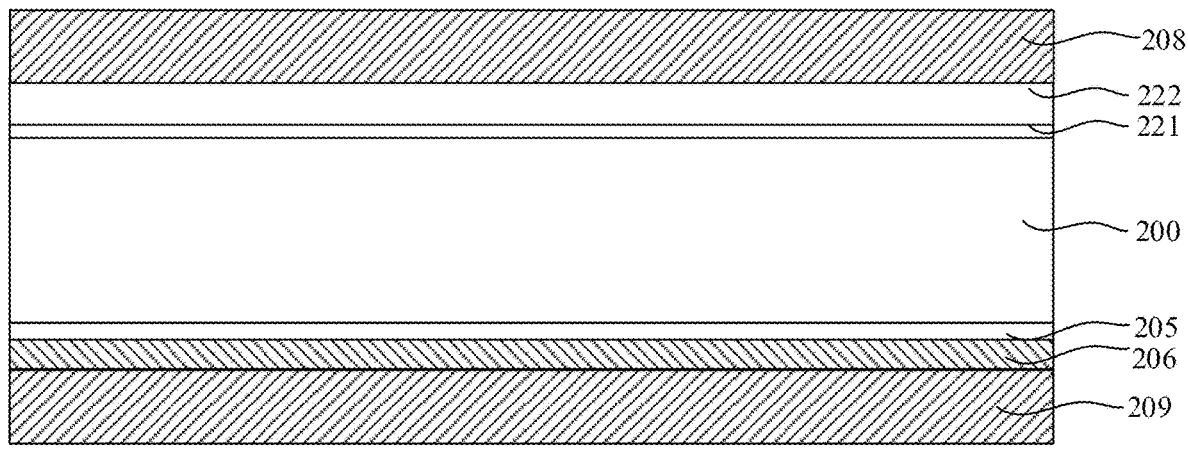
FIG. 14 is a second schematic cross-sectional structural view of the solar cell according to the second embodiment of the present disclosure.

FIG. 13 is a first schematic cross-sectional structural view of a solar cell according to a second embodiment of the present disclosure. FIG. 14 is a second schematic cross-sectional structural view of the solar cell according to the second embodiment of the present disclosure.

Correspondingly, the second embodiment of the present disclosure provides a solar cell, which is basically the same as the solar cell provided in the above embodiment, except that the first passivation layer on the second side of the solar cell described in the above embodiment is the intrinsic passivation layer, and a first passivation layer on the second side of the solar cell that will be described in the second embodiment is a second tunneling dielectric layer. For technical details that are the same as or corresponding to the technical features of the above embodiments, reference may be made to the above embodiments of the disclosure, which will not be described herein.

Referring to FIGS. 13 and 14, the solar cell includes a substrate 200 having a plurality of electrode regions 20 and a plurality of non-electrode regions 21 that are alternatingly arranged in a first direction X. The plurality of non-electrode regions 21 of the substrate include a plurality of first regions 211 and a plurality of second regions 212, where each second region 212 of the plurality of second regions 212 is disposed adjacent to a respective first region 211 of the plurality of first regions 211. The solar cell further includes a dielectric layer 221 formed over the electrode regions 20 and the second regions 212, a doped conductive layer 222 formed over the dielectric layer 221, a passivation layer 204 formed over the first regions 211 and the doped conductive layer 222, and a plurality of electrodes 208 arranged in sequence along the first direction X. Each electrode 208 is formed over a respective electrode region 20. The plurality of electrodes 208 penetrate the passivation layer 204 to be in electrical contact with the doped conductive layer 222.

In some embodiments, the substrate 200 has a first side 23 and a second side 24 disposed opposite to the first side 23.

In the solar cell shown in FIG. 13, the first side of the substrate includes a front surface, and the second side of the substrate includes a back surface. That is, in the second embodiment, the front surface of the solar cell is modified to reduce parasitic absorption on the front surface of the solar cell. The back surface of the solar cell is a TOPCon structure.

It is to be noted that for the description of the substrate 200, the electrode regions 20, the non-electrode regions 21, the dielectric layer 221, the doped conductive layer 222, the passivation layer 204, and the electrodes 208 in the second embodiment, reference may be made to the substrate 100, the electrode regions 10, the non-electrode regions 11, the dielectric layer 121, the doped conductive layer 122, the passivation layer 104, and the electrodes 108 in the above first embodiment, which are not described herein.

In some embodiments, the solar cell further includes a first passivation layer 205 disposed over the second side 24, a third doped conductive layer 206 disposed over a side of the first passivation layer 205 away from the substrate 200, and a second passivation layer 214 covering a surface of the third doped conductive layer 206 away from the substrate. The doped conductive layer 222 is doped with one of an N-type doping element and a P-type doping element and the third doped conductive layer 206 is doped with the other of the N-type doping element and the P-type doping element.

In some embodiments, the first passivation layer 205 is the second tunneling dielectric layer which forms a passivation contact structure with the third doped conductive layer 206. The solar cell further includes a plurality of third electrodes 209. The plurality of third electrodes 209 are in electrical contact with the third doped conductive layer 206 after penetrating the second passivation layer 214. For the functions, the material, and the thickness of the second tunneling dielectric layer, reference may be made to the functions, the material, and the thickness of the tunneling dielectric layer 121 in the previous embodiment, which are not be described herein. Similarly, for the functions, the material, and the thickness of the third doped conductive layer 206, reference may be made to the functions, the material, and the thickness of the doped conductive layer 122 in the previous embodiment. For example, the material of the second tunneling dielectric layer may include at least one of silicon oxide, silicon nitride, silicon oxynitride, silicon carbide, and magnesium fluoride.

By forming a local passivation contact structure on the second side, the passivation effect of the solar cell can be improved, and the surface defects on the second side of the substrate can be reduced, thus improving the cell efficiency of the solar cell.

Figure 15:
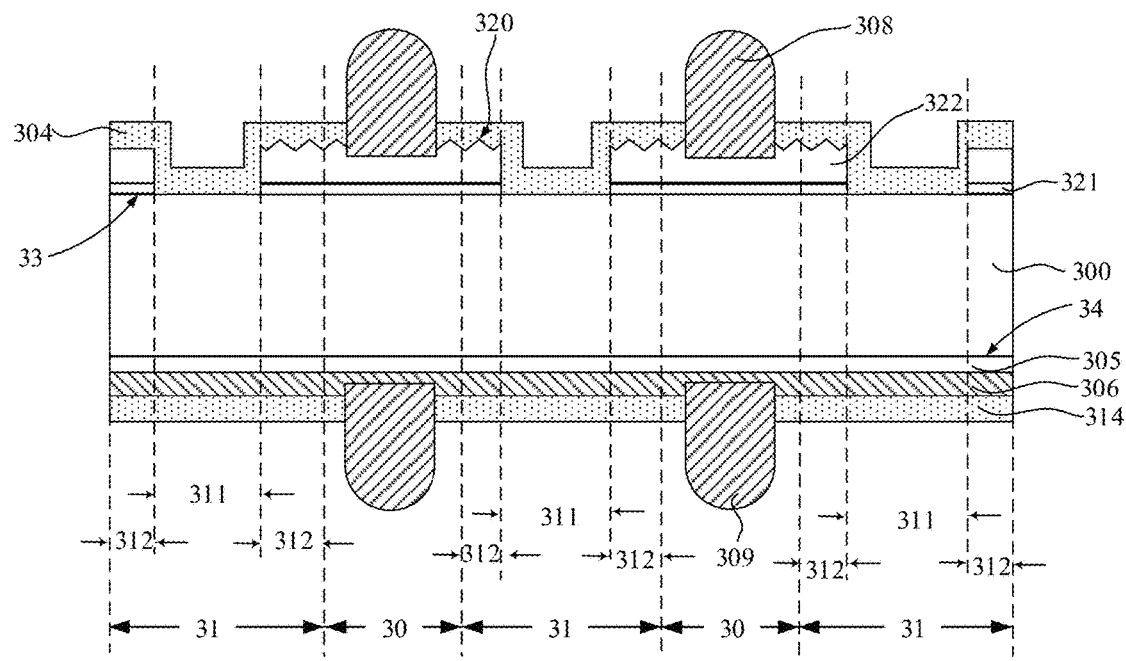
FIG. 15 is a first schematic cross-sectional structural view of a solar cell according to a third embodiment of the present disclosure.
Figure 16:
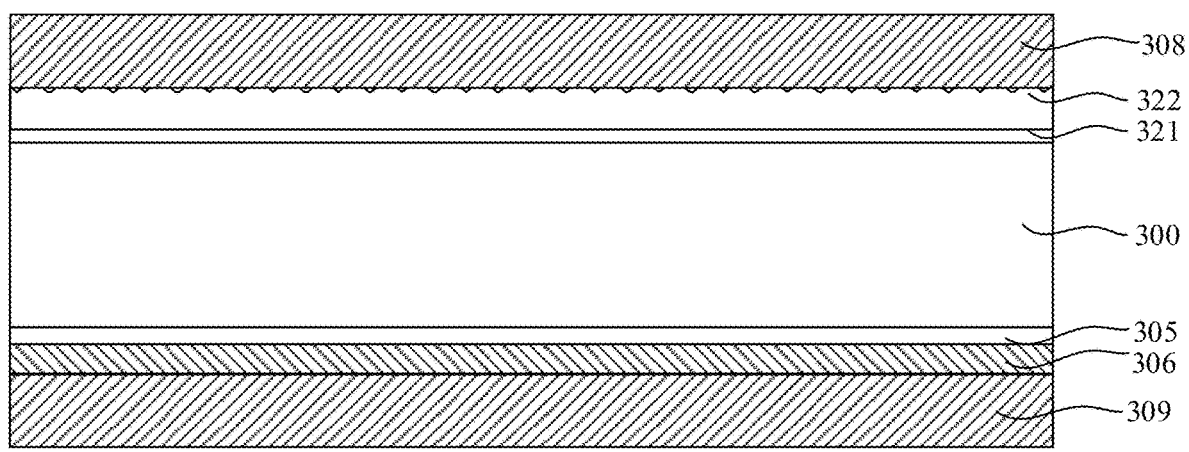
FIG. 16 is a second schematic cross-sectional structural view of the solar cell according to the third embodiment of the present disclosure.

FIG. 15 is a first schematic cross-sectional structural view of a solar cell according to a third embodiment of the present disclosure. FIG. 16 is a second schematic cross-sectional structural view of the solar cell according to the third embodiment of the present disclosure.

Correspondingly, the third embodiment of the disclosure provides a solar cell, which is basically the same as the solar cell provided in the above embodiments, except that a surface of the doped conductive layer far away from the dielectric layer in the above embodiments is a flat surface, and a surface of the doped conductive layer far away from the dielectric layer in the third embodiment is a concave-convex surface. For technical details that are the same as or corresponding to the technical features of the above embodiments, reference may be made to the above embodiments of the disclosure, which will not be described herein.

Referring to FIGS. 15 and 16, the solar cell includes a substrate 300 having a plurality of electrode regions 30 and a plurality of non-electrode regions 31 that are alternatingly arranged in a first direction X. The plurality of non-electrode regions 31 of the substrate include a plurality of first regions 311 and a plurality of second regions 312, where each second region 312 of the plurality of second regions 312 is disposed adjacent to a respective first region 311 of the plurality of first regions 311. The solar cell further includes a dielectric layer 321 formed over the electrode regions 30 and the second regions 312, a doped conductive layer 322 formed over the dielectric layer 321, a passivation layer 304 formed over the first region 311 and the doped conductive layer 322, and a plurality of electrodes 308 arranged in sequence along the first direction X. Each electrode 308 is formed over a respective electrode region 30. The plurality of electrodes 308 penetrate the passivation layer 304 to be in electrical contact with the doped conductive layer 322.

In some embodiments, the substrate 300 has a first side 33 and a second side 34 disposed opposite to the first side 33. In the solar cell shown in FIG. 15, the first side of the substrate includes a front surface and the second side of the substrate includes a back surface.

In some embodiments, referring to FIG. 15, a side of the doped conductive layer 322 away from the dielectric layer 321 includes a micro-textured structure 320, and thus, a surface of the doped conductive layer 322 away from the dielectric layer 321 includes a concave-convex surface. The micro-textured structure 320 includes a plurality of micro-protrusion structures. Surface roughness of the micro-textured structure 320 is greater than surface roughness of the electrode regions. If the roughness of the micro-textured structure 320 is greater, the contact performance between the electrodes 308 and the doped conductive layer 322 is better, resulting in a higher welding tension between the electrodes 308 and the doped conductive layer 322, thereby improving the yield of the solar cell.

In some embodiments, each micro-protrusion structure may have a pyramid shape, a sinusoidal shape, or a parabolic shape.

In some embodiments, each micro-protrusion structure has a size less than 1 µm. The size of the micro-protrusion structure is less than 890 nm. The size of the micro-protrusion structure is less than 760 nm. The size of the micro-protrusion structure is less than 620 nm. The size of the micro-protrusion structure is less than 500 nm. The size of the micro-protrusion structure is less than 320 nm. Therefore, if the size of the micro-protrusion structure is within any of the above-mentioned ranges, the size of the micro-protrusion structure is relatively small, an etching time for the doped conductive layer 322 and the etching degree of the doped conductive layer 322 are small, thereby avoiding more etching loss to the doped conductive layer 322 and ensuring a good passivation effect of the doped conductive layer 322.

In some embodiments, the size of the micro-protrusion structure refers to an average value of one-dimensional bottom sizes of micro-protrusion structures within any region of the surface of the doped conductive layer, where each one-dimensional bottom size is a one-dimensional size of a bottom surface of a respective micro-protrusion structure of the micro-protrusion structures. It can be understood that the range of the size of the micro-protrusion structure refers to a range of an average value of sizes of the micro-protrusion structures within a region (i.e., average one-dimensional size), not all ranges of sizes of all the micro-protrusion structures of the doped conductive layer. All the ranges of the dimensions of the micro-protrusion structures of the doped conductive layer are generally larger than the range of the average value of the sizes of the micro-protrusion structures within the region. For illustration, the micro-protrusion structures in FIG. 15 have a substantially same morphology and the size of each micro-protrusion structure is equal to the average one-dimensional size.

It is to be noted that the one-dimensional size refers to a distance between two diagonal corners in a bottom pattern of the micro-protrusion structure. In some embodiments, the one-dimensional size may also be a distance between two opposing sides of the bottom pattern of the micro-protrusion structure. A surface of the plurality of micro-protrusion structures close to the second side 34 are fitted so as to construct a virtual surface as the bottom surface, that is, the bottom surface is a simulated surface, which does not exist in the actual cell. For example, a surface of each of at least one of the micro-protrusion structures adjacent to the second side 34 is flush with the bottom surface, and a surface of each of other micro-protrusion structures of the micro-protrusion structures adjacent to the second side 34 is higher or lower than the bottom surface, all of which are micro-protrusion structures in accordance with embodiments of the present disclosure.

In some embodiments, a height of each micro-protrusion structure is less than 1 µm. For example, the height of the micro-protrusion structure is less than 910 nm. The height of the micro-protrusion structure is less than 810 nm. The height of the micro-protrusion structure is less than 590 nm. The height of the micro-protrusion structure is less than 430 nm. The height of the micro-protrusion structure is less than 220 nm. Therefore, when the height of the micro-protrusion structure is within any of the above-mentioned ranges, the height of the micro-protrusion structure is small, and the surface roughness of the doped conductive layer is small. The passivation layer 304 is located not only at recesses of the micro-protrusion structure, but also at protrusions of the micro-protrusion structure (i.e., the passivation layer 304 is disposed over the surface of the each of the plurality of micro-protrusion structures), so that the interface recombination function can be better provided. The height of the micro-protrusion structure refers to a vertical distance between a highest point of the micro-protrusion structure far away from the electrode regions and the bottom pattern.

In addition, if the height and size of the micro-protrusion structure are within any of the above ranges, the micro-protrusion structure has a larger aspect ratio, and an inclined plane of the micro-protrusion structure can reflect the incident light multiple times, thus improving the utilization rate of the light.

It is to be noted that for the description of the substrate 300, the electrode regions 30, the non-electrode regions 31, the dielectric layer 321, the doped conductive layer 322, the passivation layer 304, the electrodes 308, the first passivation layer 305, the third doped conductive layer 306, and the second passivation layer 314 in the third embodiment, reference may be made to the substrate 200, the electrode regions 20, the non-electrode regions 21, the dielectric layer 221, the doped conductive layer 222, the passivation layer 204, the electrodes 208, the first passivation layer 205, the third doped conductive layer 206, and the second passivation layer 214 in the above embodiments, which are not described herein.

Figure 17:
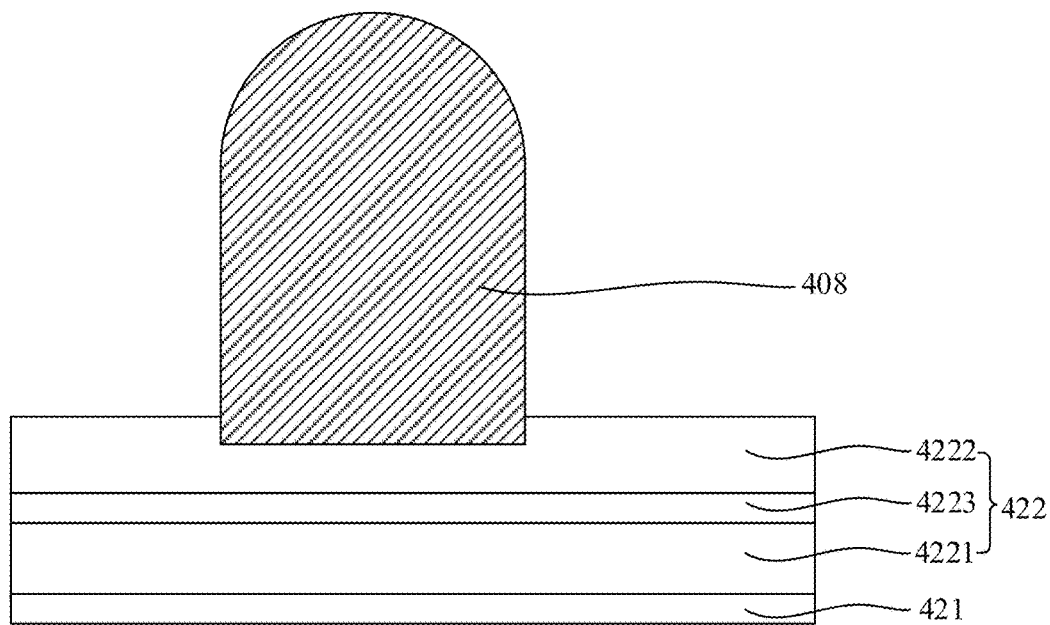
FIG. 17 is a partial schematic structural view of a doped conductive layer and an electrode in the solar cell according to a fourth embodiment of the present disclosure.

FIG. 17 is a partial schematic structural view of a doped conductive layer and an electrode in the solar cell according to a fourth embodiment of the present disclosure.

Correspondingly, the fourth embodiment of the disclosure provides a solar cell, which is basically the same as the solar cell provided in the above embodiments, except that the doped conductive layer in the above embodiments is a single film layer, the doped conductive layer in the fourth embodiment includes multiple sub-doped conductive layers, and there is an interface layer between adjacent sub-doped conductive layers. For technical details that are the same as or corresponding to the technical features of the above embodiments, reference may be made to the above embodiments of the disclosure, which will not be described herein.

In some embodiments, the solar cell includes a substrate having electrode regions and non-electrode regions that are alternatingly arranged in a first direction. The plurality of non-electrode regions of the substrate include a plurality of first regions and a plurality of second regions, where each second region of the plurality of second regions is disposed adjacent to a respective first region of the plurality of first regions. The solar cell further includes a dielectric layer 421 formed over the electrode regions and the second regions, a doped conductive layer 422 disposed over the dielectric layer 421, a passivation layer disposed over the first regions and the doped conductive layer 422, and a plurality of electrodes 408 arranged sequentially along the first direction. Each electrode 408 is formed over a respective electrode region. The plurality of electrodes 408 burn through the passivation layer to be in electrical contact with the doped conductive layer 422.

The substrate 400 has a first side and a second side disposed opposite to the first side. In the solar cell shown in FIG. 17, the first side of the substrate includes a front surface and the second side of the substrate includes a back surface.

In some embodiments referring to FIG. 17, the doped conductive layer 422 includes a plurality of sequentially stacked sub-doped conductive layers, where an interface layer 4223 is disposed between two adjacent sub-doped conductive layers.

In some examples, there may be the interface layer between the two adjacent sub-doped conductive layers. In some examples, there is no interface layer between the two adjacent sub-doped conductive layers, i.e., the two adjacent sub-doped conductive layers are directly in contact with each other. In some examples, there may be multiple interface layers between the two adjacent sub-doped conductive layers.

In some embodiments, the plurality of sub-doped conductive layers include at least a first sub-doped conductive layer 4221 and a second sub-doped conductive layer 4222.

In some embodiments, a material of at least one of the first sub-doped conductive layer 4221 and the second sub-doped conductive layer 4222 includes at least one of amorphous silicon, polysilicon, and silicon carbide.

In some embodiments, a material of the interface layer 4223 may include at least one of silicon oxide, silicon nitride, silicon oxynitride, silicon carbide, and magnesium fluoride.

In the solar cell provided in the fourth embodiment, by arranging the doped conductive layer including the plurality of sub-doped conductive layers, a thickness of each sub-doped conductive layer is reduced, the parasitic absorption of the sub-doped conductive layer is reduced, and the optical loss of the solar cell is reduced. In addition, using plurality of sub-doped conductive layers can avoid the problem that silver paste material of the electrodes burns through the dielectric layer, thus ensuring the tunneling function of the dielectric layer and improving the passivation effect of the solar cell.

Figure 18:
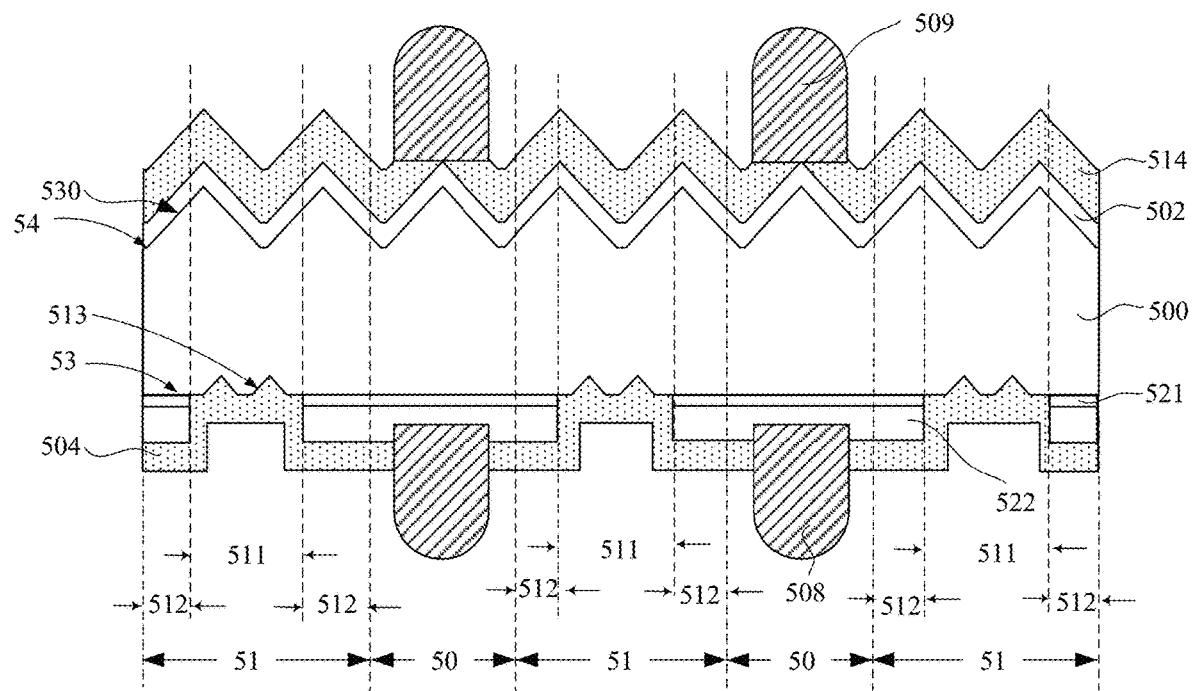
FIG. 18 is a first schematic cross-sectional structural view of a solar cell according to a fifth embodiment of the present disclosure.
Figure 19:
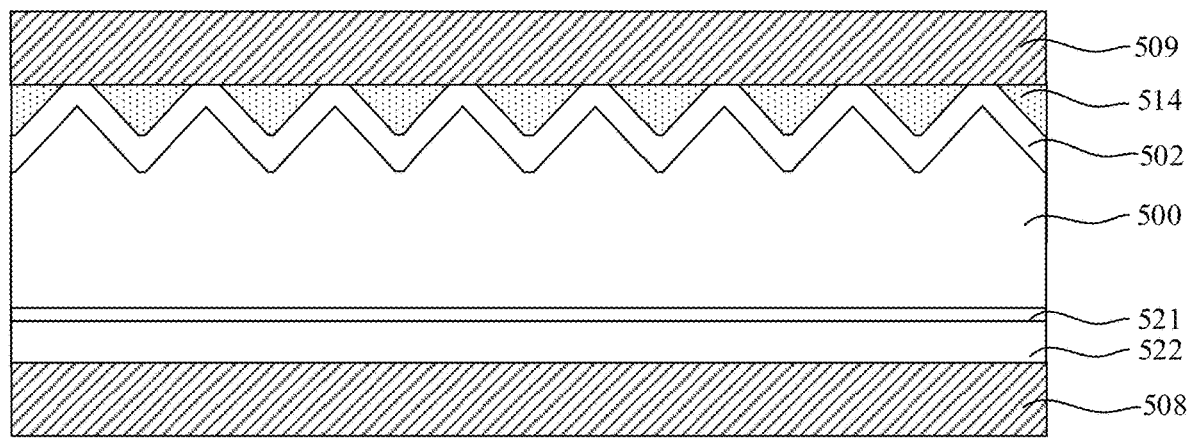
FIG. 19 is a second schematic cross-sectional structural view of a solar cell according to the fifth embodiment of the present disclosure.

FIG. 18 is a first schematic cross-sectional structural view of a solar cell according to a fifth embodiment of the present disclosure. FIG. 19 is a second schematic cross-sectional structural view of a solar cell according to the fifth embodiment of the present disclosure.

Correspondingly, the fifth embodiment of the present disclosure provides a solar cell, which is basically the same as the solar cell provided in the above embodiments, except that the second side in the above embodiments includes a flat surface, and a second side in the fifth embodiment has a textured structure and an emitter. For technical details that are the same as or corresponding to the technical features of the above embodiments, reference may be made to the above embodiments of the disclosure, which will not be described herein.

Referring to FIGS. 18 and 19, the solar cell includes a substrate 500 having a plurality of electrode regions 50 and a plurality of non-electrode regions 51 that are alternatingly arranged in a first direction X. The plurality of non-electrode regions 51 of the substrate include a plurality of first regions 511 and a plurality of second regions 512, where each second region 512 of the plurality of second regions 512 is disposed adjacent to a respective first region 511 of the plurality of first regions 511. The solar cell further includes a dielectric layer 521 formed over the electrode regions 50 and the second regions 512, a doped conductive layer 522 formed over the dielectric layer 521, a passivation layer 504 formed over the first regions 511 and the doped conductive layer 522, and a plurality of electrodes 508 arranged in sequence along the first direction X. Each electrode 508 is formed over a respective electrode region 50. The plurality of electrodes 508 penetrate the passivation layer 504 to be in electrical contact with the doped conductive layer 522.

The substrate 500 has a first side 53 and a second side 54 disposed opposite to the first side 53. In the solar cell shown in FIG. 18, the first side of the substrate includes a back surface and the second side of the substrate includes a front surface.

In some embodiments, surface roughness of the second side 54 is greater than surface roughness of the first side 53. That is, the second side 54 may include a surface having a concave-convex structure disposed thereon. By increasing the internal reflection of incident light, the utilization rate of light by the solar cell can be improved, thereby improving the photoelectric conversion efficiency of the cell.

In some embodiments, the second side 54 has a textured structure 530. The textured structure 530 includes a plurality of protrusion structures. Each protrusion structure may have a pyramid shape, a parabolic shape, or an elliptical-sphere shape.

In some embodiments, the solar cell further includes an emitter 502 disposed over the electrode regions 50 and the non-electrode regions 51. The emitter 502 is disposed over the second side of the substrate 500. A PN junction is formed between the emitter 502 and the substrate 100.

In some embodiments, the emitter 502 and the substrate 500 include a same material, and the emitter 502 and the substrate 500 may be separately fabricated from a same substrate through a diffusion process.

It is to be noted that for the description of the substrate 500, the electrode regions 50, the non-electrode regions 51, the dielectric layer 521, the doped conductive layer 522, the passivation layer 504, the electrodes 508, the second passivation layer 514, and grooves 513 in the fifth embodiment, reference may be made to the substrate 200, the electrode regions 20, the non-electrode regions 21, the dielectric layer 221, the doped conductive layer 222, the passivation layer 204, the electrodes 208, the second passivation layer 214, and the grooves 113 in the above embodiments, which are not described herein.

Figure 20:
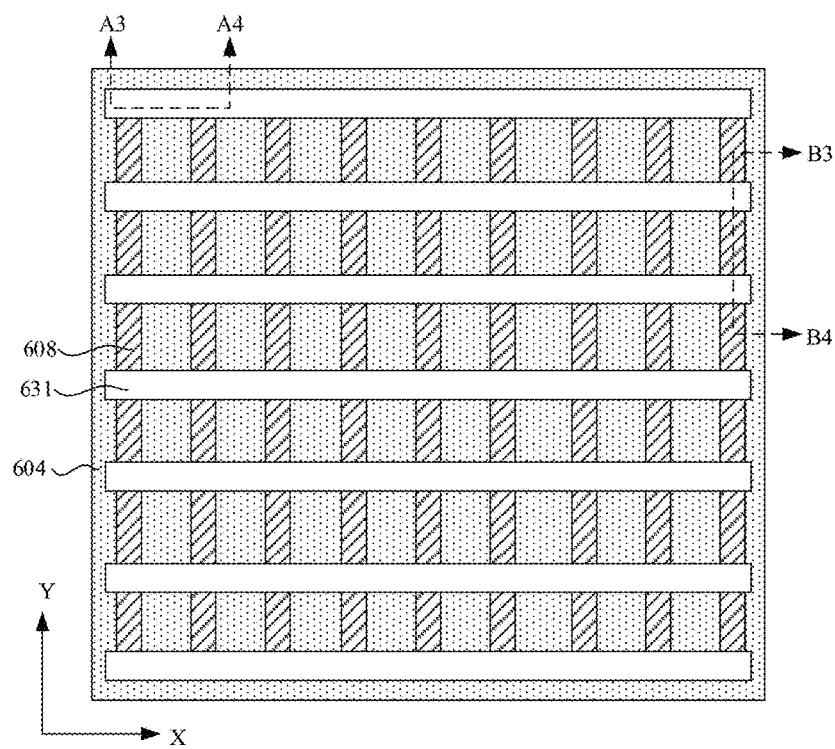
FIG. 20 is a schematic structural view of a solar cell according to a sixth embodiment of the present disclosure.
Figure 21:
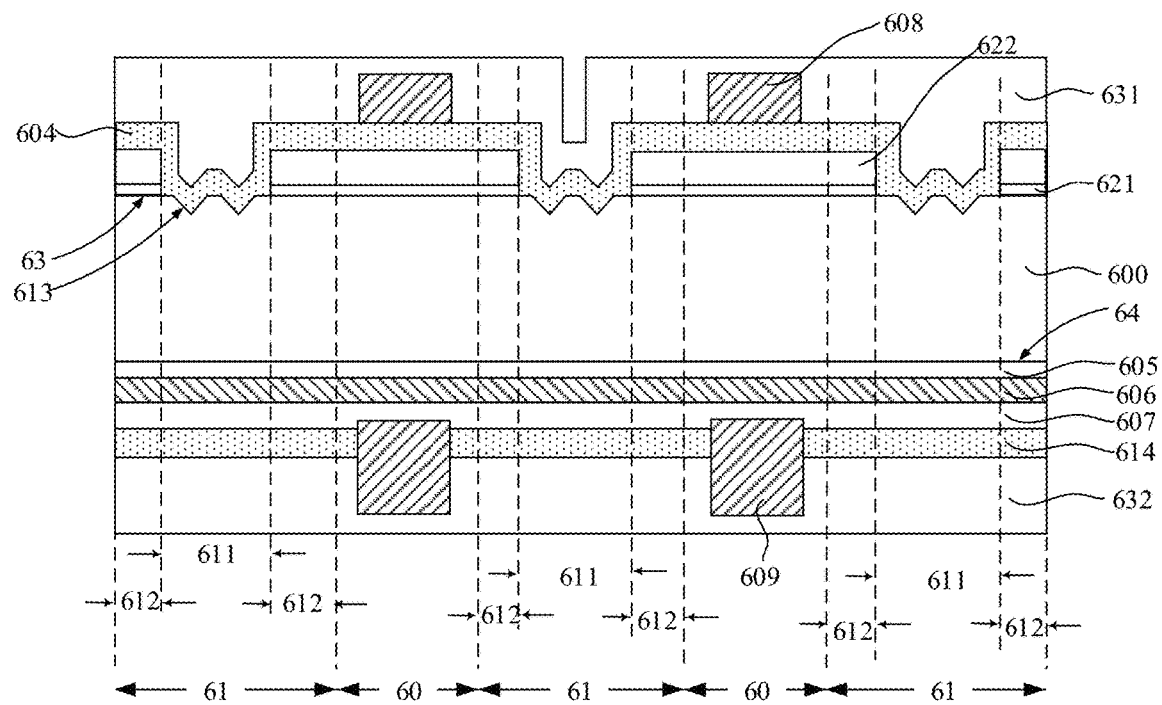
FIG. 21 is a schematic cross-sectional structural view of FIG. 20 along section A3-A4.
Figure 22:
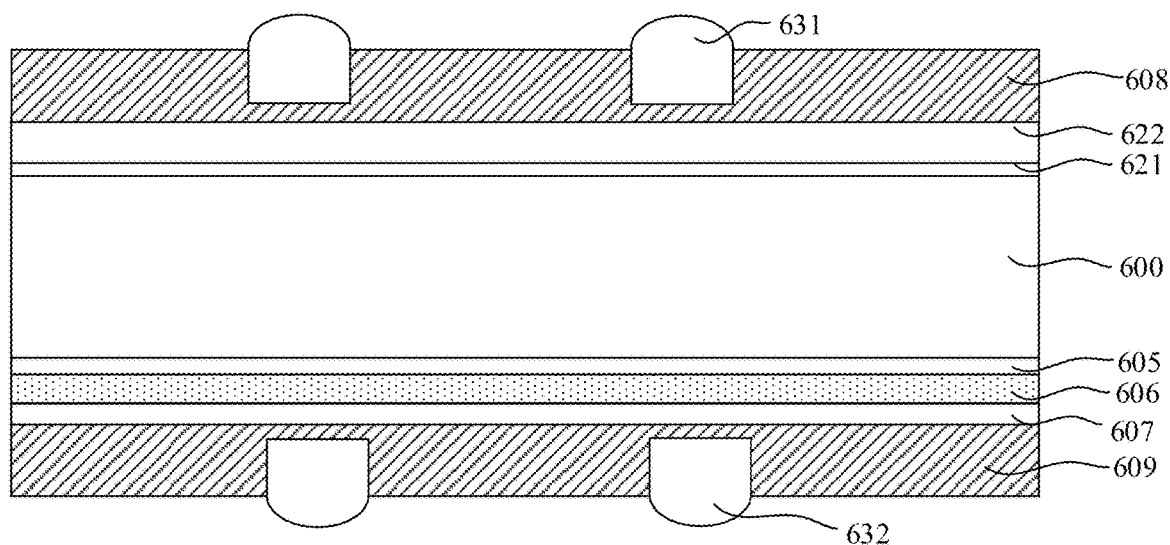
FIG. 22 is a schematic cross-sectional structural view of FIG. 20 along section B3-B4.

FIG. 20 is a schematic structural view of a solar cell according to a sixth embodiment of the present disclosure. FIG. 21 is a schematic cross-sectional structural view of FIG. 20 along section A3-A4. FIG. 22 is a schematic cross-sectional structural view of FIG. 20 along section B3-B4.

Correspondingly, the sixth embodiment of the disclosure provides a solar cell, which is basically the same as the solar cell provided in the above embodiments, except that the solar cell in the above embodiments includes electrodes, and the solar cell in the sixth embodiment includes electrodes and main busbars. For technical details that are the same as or corresponding to the technical features of the above embodiments, reference may be made to the above embodiments of the disclosure, which will not be described herein.

Referring to FIGS. 21 and 22, the solar cell includes a substrate 600 having a plurality of electrode regions 60 and a plurality of non-electrode regions 61 that are alternatingly arranged in a first direction X. The plurality of non-electrode regions 61 of the substrate include a plurality of first regions 611 and a plurality of second regions 612, where each second region 612 of the plurality of second regions 612 is disposed adjacent to a respective first region 611 of the plurality of first regions 611. The solar cell further includes a dielectric layer 621 formed over the electrode regions 60 and the second regions 612, a doped conductive layer 622 formed over the dielectric layer 621, a passivation layer 604 formed over the first regions 611 and the doped conductive layer 622, and a plurality of electrodes 608 arranged in sequence along the first direction X. Each electrode 608 is formed over a respective electrode region 60. The plurality of electrodes 608 penetrate the passivation layer 604 to be in electrical contact with the doped conductive layer 622.

The substrate 600 has a first side 63 and a second side 64 disposed opposite to the first side 63. In the solar cell shown in FIG. 21, the first side of the substrate includes a front surface and the second side of the substrate includes a back surface.

In some embodiments, the solar cell further includes first main busbars 631 arranged sequentially along a second direction Y. Each first main busbar is in electrical contact with the plurality of electrodes arranged along the first direction. The solar cell further includes a plurality of second main busbars 632 arranged sequentially along the second direction Y. Each second main busbar 632 is in electrical contact with a plurality of third electrodes 609 arranged along the first direction.

In some embodiments, the first main busbars 631 and/or the second main busbars 632 are used to converge current of the electrodes and the third electrodes and transmit the current to solder strips to be collected by the solder strips. The first main busbars and the second main busbars can be prepared from non-burn-through type paste. The non-burn-through type paste is printed to enable the non-burn-through type paste to be in direct contact with the electrodes or the third electrodes, and the non-burn-through type paste has less damage to the passivation layer 604. That is, the non-burn-through type paste does not have too much glass powder to damage the PN junction, so that the metal recombination can be effectively reduced, the open-circuit voltage of the solar cell can be improved, and the conversion efficiency of the solar cell can be improved.

The traditional paste includes a mixture of metal powder, glass powder, and organic carrier. The non-burn-through type paste refers to paste in which content of glass powder is less than content of the glass powder contained in the traditional paste. The non-burn-through type paste has weak burn-through ability during sintering, so that the non-burn-through type paste does not need to burn through or cannot burn through the paste of the passivation layer. The burn-through type paste refers to paste with strong burn-through ability and that can burn through the passivation layer during sintering.

It is to be noted that for the description of the substrate 600, the electrode regions 60, the non-electrode regions 61, the dielectric layer 621, the doped conductive layer 622, the passivation layer 604, the electrodes 608, the second passivation layer 614, and the grooves 613 in the sixth embodiment, reference may be made to the substrate 100, the electrode regions 10, the non-electrode regions 11, the dielectric layer 121, the doped conductive layer 122, the passivation layer 104, the electrodes 108, the first passivation layer 105, the third doped conductive layer 106, the second transparent conductive layer 107, the second passivation layer 114, and the grooves 113 in the above embodiments, which are not described herein.

Figure 23:
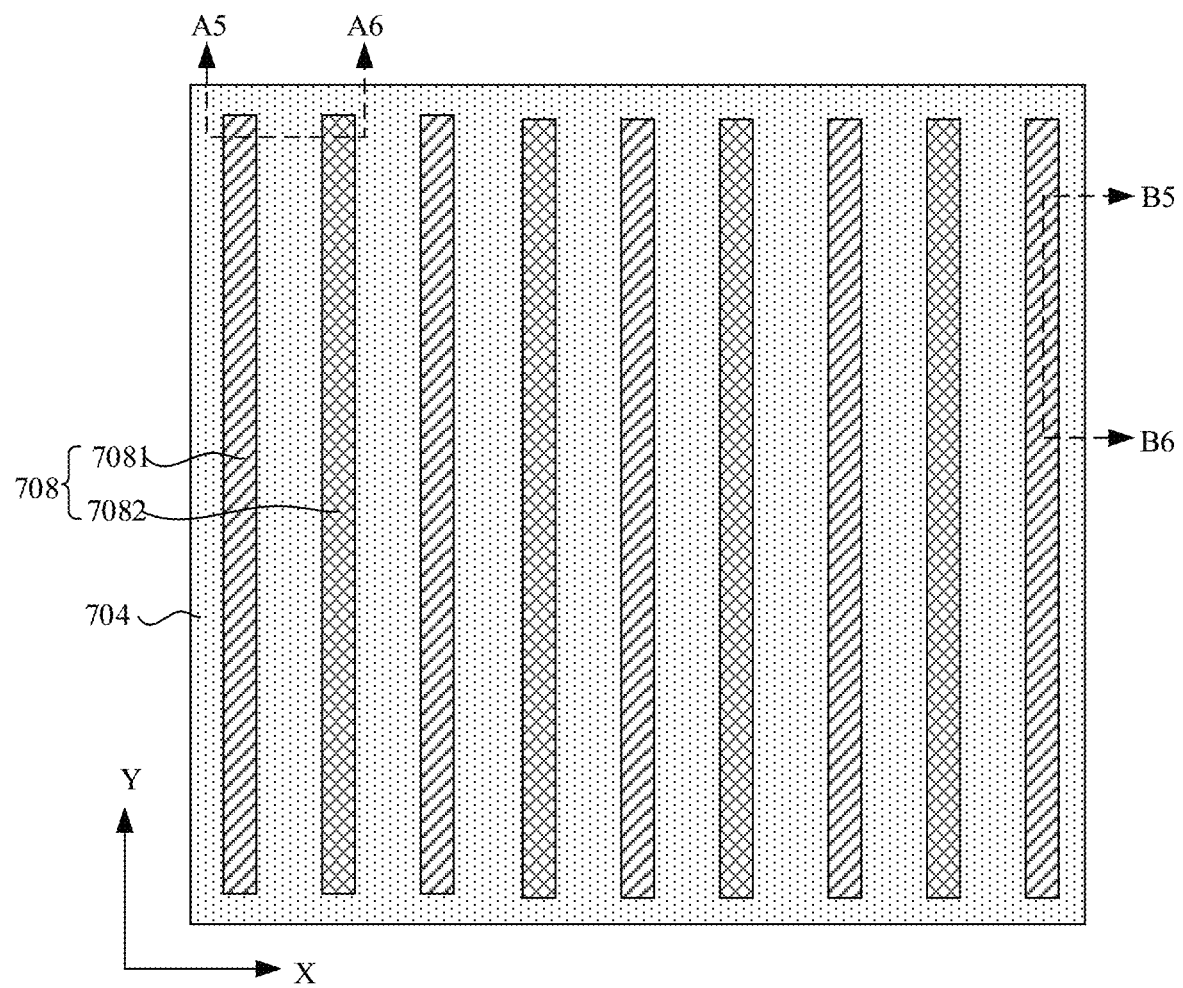
FIG. 23 is a schematic structural view of the solar cell according to a seventh embodiment of the present disclosure.
Figure 24:
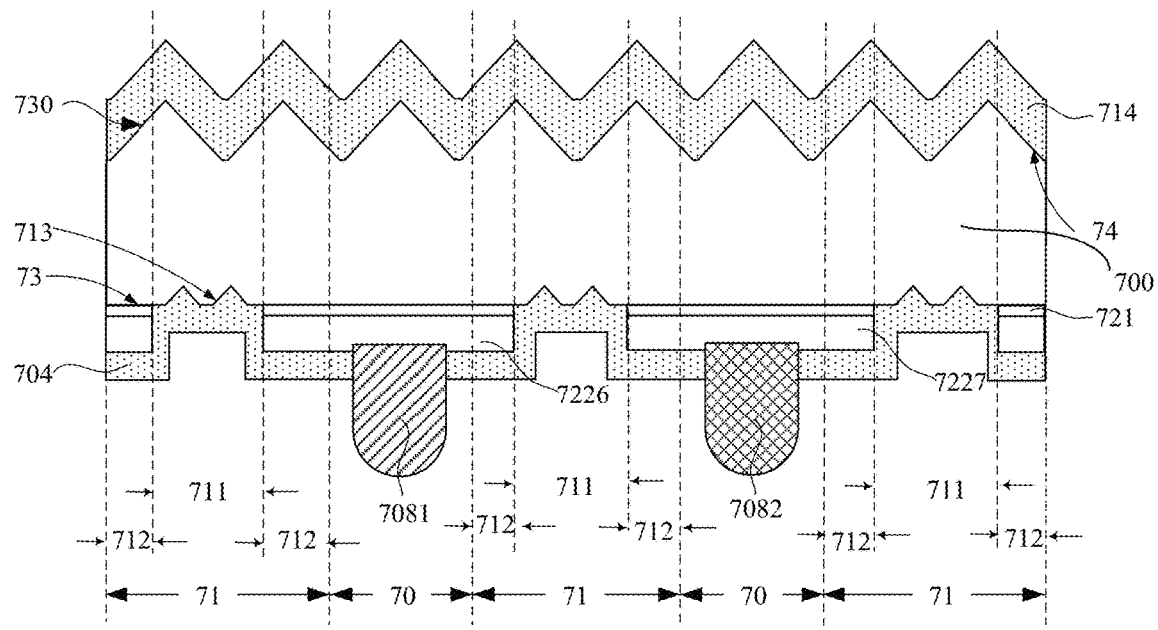
FIG. 24 is a schematic cross-sectional structural view of FIG. 23 along section A5-A6.
Figure 25:
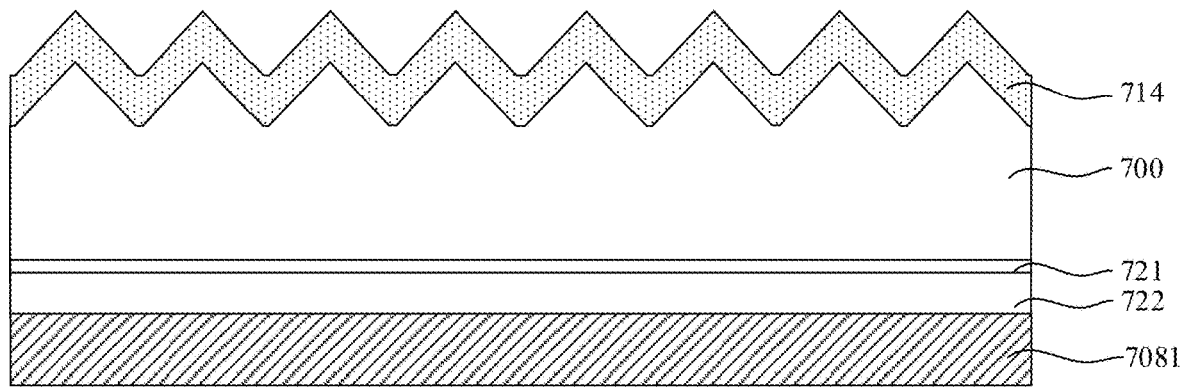
FIG. 25 is schematic cross-sectional structural view of FIG. 23 along section B5-B6.

FIG. 23 is a schematic structural view of the solar cell according to a seventh embodiment of the present disclosure. FIG. 24 is a schematic cross-sectional structural view of FIG. 23 along section A5-A6. FIG. 25 is schematic cross-sectional structural view of FIG. 23 along section B5-B6.

Correspondingly, the seventh embodiment of the disclosure provides a solar cell, which is basically the same as the solar cell provided in the above embodiments, except that the electrodes and the third electrodes in the above embodiments are disposed over two opposing sides of the substrate, and first electrodes and second electrodes in the seventh embodiment are disposed over a same side of the substrate. For technical details that are the same as or corresponding to the technical features of the above embodiments, reference may be made to the above embodiments of the disclosure, which will not be described herein.

Referring to FIGS. 24 and 25, the solar cell includes a substrate 700 having a plurality of electrode regions 70 and a plurality of non-electrode regions 71 that are alternatingly arranged in a first direction X. The plurality of non-electrode regions 71 of the substrate include a plurality of first regions 711 and a plurality of second regions 712, where each second region 712 of the plurality of second regions 712 is disposed adjacent to a respective first region 711 of the plurality of first regions 711. The solar cell further includes a dielectric layer 721 formed over the electrode regions 70 and the second regions 712, a doped conductive layer formed over the dielectric layer 721, a passivation layer 704 formed over the first regions 711 and the doped conductive layer, and a plurality of electrodes 708 arranged in sequence along the first direction X. Each electrode 708 is formed over a respective electrode region 70. The plurality of electrodes 708 penetrate the passivation layer 704 to be in electrical contact with the doped conductive layer.

The substrate 700 has a first side 73 and a second side 74 disposed opposite to the first side 73. In the solar cell shown in FIG. 24, the first side of the substrate includes a back surface and the second side of the substrate includes a front surface.

In some embodiments, the doped conductive layer includes a first doped conductive layer 7226 and a second doped conductive layer 7227. The first doped conductive layer 7226 is doped with one of an N-type doping element and a P-type doping element and the second doped conductive layer 7227 is doped with the other of the N-type doping element and the P-type doping element. The first doped conductive layer 7226 and the second doped conductive layer 7227 are formed over the dielectric layer 721. The plurality of electrodes 708 include a plurality of first electrodes 7081 and a plurality of second electrodes 7082 that are alternatingly arranged (interleaved with each other). The plurality of first electrodes 7081 are in electrical contact with the first doped conductive layer 7226 after penetrating the passivation layer 704, and the plurality of second electrodes 7082 are in electrical contact with the second doped conductive layer 7227 after penetrating the passivation layer 704.

For a material and a thickness of the first doped conductive layer 7226 and the second doped conductive layer 7227, reference may be made to the material and thickness settings of the doped conductive layer 122 in the above embodiments, and only the first doped conductive layer is ensured to be doped with one of the N-type doping element and the P-type doping element, and the second doped conductive layer is doped with the other of the N-type doping element and the P-type doping element. In other words, the first electrodes 7081 and the second electrodes 7082 have different conductivity types. For example, each first electrode 7081 is an electrode of a positive polarity, and each electrode 7082 is an electrode of a negative polarity. Alternatively, each first electrode 7081 is an electrode of a negative polarity, and each electrode 7082 is an electrode of a positive polarity.

Similarly, for a material and a thickness of the dielectric layer 721, reference may be made to the material and thickness of the dielectric layer 121 in the above embodiments, and for a material and a thickness of the first electrodes 7081 and second electrodes 7082, reference may be made to the material and thickness of the electrodes 108 in the above embodiments.

In this way, the solar cell can be a TBC (TOPCon-BC) cell or an HJT-BC (HBC) cell. By changing the selective carrier contact passivation material of the TOPCon cell, the recombination current of the cell is reduced to the limit, thus improving the conversion efficiency of the crystalline silicon cell close to its theoretical limit. In addition, the TBC cell and the HBC cell can be applied to a laminated cell, and combined with low resistance tunneling layer technology in the middle layer of a top cell and a bottom cell, conformal deposition technology of the top cell on the textured surface of the crystalline silicon, spectrum distribution technology and metallization technology of the top cell and the bottom cell, to improve cell efficiency.

It is to be noted that for the description of the substrate 700, the electrode regions 70, the non-electrode regions 71, the dielectric layer 721, the doped conductive layer, the passivation layer 704, the electrodes 708, the second passivation layer 714, and the grooves 713 in the seventh embodiment, reference may be made to the substrate 500, the electrode regions 50, the non-electrode regions 51, the dielectric layer 521, the doped conductive layer 522, the passivation layer 504, the electrodes 508, the second passivation layer 514, and the grooves 513 in the above embodiments, which are not repeated herein.

Accordingly, according to some embodiments of the present disclosure, embodiments of the present disclosure further provide a method for manufacturing a solar cell, which can be used for manufacturing the solar cell provided in any of the above embodiments. For details of the technical features same as or corresponding to technical features in the above embodiments, reference may be made to the above embodiments, which are not repeated herein.

The method for manufacturing a solar cell includes following operations. A substrate is provided, where the substrate has electrode regions and non-electrode regions that are alternatingly arranged. The plurality of non-electrode regions include a plurality of first regions and a plurality of second regions, where each second region of the plurality of second regions is disposed adjacent to a respective first region of the plurality of first regions. A dielectric layer is formed over the electrode regions and the second regions. A doped conductive layer is formed over a side of the dielectric layer far away from the substrate. A passivation layer is formed over the first regions and the doped conductive layer. A plurality of electrodes arranged sequentially along a first direction are formed, where each electrode is formed over a respective electrode region. The plurality of electrodes burn through the passivation layer to be in electrical contact with the doped conductive layer. The method may be explained in detail below.

The method includes providing the substrate, where the substrate has an initial surface structure on a surface of the substrate, and the (initial/original) substrate has electrode regions and non-electrode regions that are alternatingly arranged.

In some embodiments, the substrate includes a first side having the initial surface structure and a second side, where the initial surface structure includes a polished surface.

The method further includes sequentially forming an initial passivation film and a doped conductive film on the surface of the substrate, where the initial passivation film is formed over the initial surface structure, and the doped conductive film formed over the initial passivation film.

If the solar cell of FIG. 15 is formed, the method further includes performing an etching process on the doped conductive film so that a surface of the doped conductive film away from the initial passivation film has a micro-textured structure, where the micro-textured structure includes at least one micro-protrusion structure.

In some embodiments, the etching process includes at least one of a solution etching process and a laser etching process.

The method further includes following operations. Shaping treatment is performed on the initial passivation film and the doped conductive film that are formed over the non-electrode regions. The shaping treatment is used for removing a part of the initial passivation film and a part of the doped conductive film that correspond to a part of a respective non-electrode region of the non-electrode regions, where a part of the substrate not covered by the initial passivation film and the doped conductive film becomes the plurality of first regions, a remaining portion of the respective non-electrode region becomes a second region, a remaining portion of the initial passivation film becomes the dielectric layer, and a remaining portion of the doped conductive film becomes the doped conductive layer.

In some embodiments, the shaping treatment includes a wet etching process.

In some embodiments, in process parameters of the wet etching process: a reaction solution includes an acid solution, and a reaction time for the wet etching process includes 50 s to 550 s.

In some embodiments, process operations of the wet etching process may include: (1) using a mixed acid solution containing HF with mass concentration of 10-25%, $HNO_3$ with mass concentration of 5-10%, and $H_2SO_4$ with mass concentration of 2-4%, respectively, to pattern, by using screen printing, a surface of non-metallic regions (i.e., non-electrode regions) with an action amount of 0.05 $mL/cm^2$ to 0.8 $mL/cm^2$ and an action time of 50 s to 550 s; (2) after treatment, deionized water/low concentration alkaline solution (e.g., NaOH of 0.5% to 1%)/low concentration HCl (2.5% to 3.5%) was used for alternate cleaning the structure obtained after the shaping treatment twice.

In some embodiments, prior to performing the shaping treatment on the initial passivation film and the doped conductive film that are formed over the non-electrode regions, a mask layer is formed over the electrode regions of the substrate. A material of the mask layer includes at least one of organic wax, metal, and silicon dioxide mask.

In some embodiments, the mask layer is formed using a printing process.

The method further includes: removing the mask layer.

The method further includes: forming a passivation layer, where the passivation layer is disposed over the first regions and the doped conductive layer.

The method further includes: forming a plurality of electrodes arranged sequentially along a first direction, where each electrode is formed over a respective electrode region, and the plurality of electrodes burn through the passivation layer to be in electrical contact with the doped conductive layer.

The method further includes forming a first passivation layer, a third doped conductive layer, and a plurality of third electrodes.

In some embodiments, providing the substrate includes: providing an initial substrate having a textured structure on a surface of the initial substrate, where the original substrate has electrode regions and non-electrode regions that are alternatively arranged. A part of the textured structure corresponding to the electrode regions are retained, another part of the textured structure corresponding to the non-electrode regions are removed, and an etching process is performed on a part of a respective non-electrode region of the non-electrode regions to define at least one groove. The part of the respective non-electrode region after being subjected to the etching process is used as the first region, and a remaining portion of the respective non-electrode region without being subjected to the etching process becomes the second region.

Figure 26:
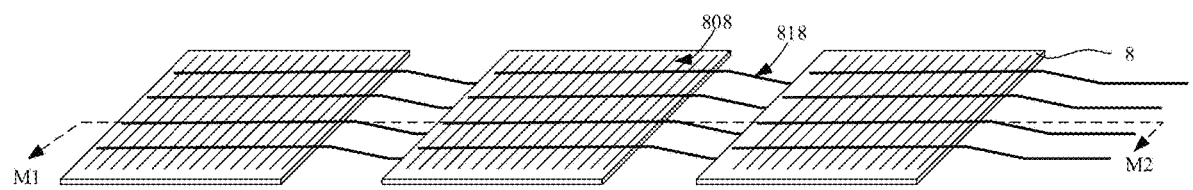
FIG. 26 is a schematic structural view of the photovoltaic module according to embodiments of the present disclosure.
Figure 27:
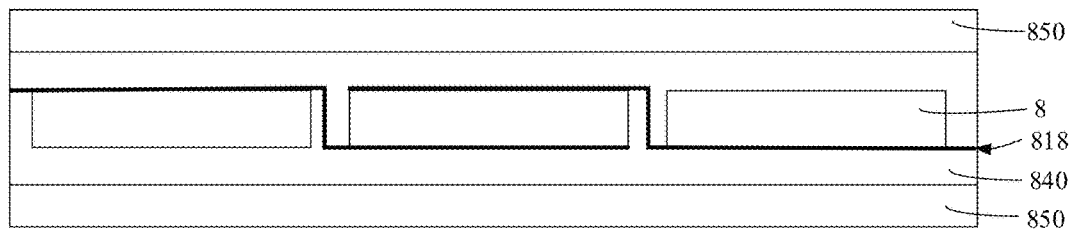
FIG. 27 is a schematic cross-sectional view of FIG. 26 along the section M1-M2.

FIG. 26 is a schematic structural view of the photovoltaic module according to another embodiment of the present disclosure. FIG. 27 is a schematic cross-sectional view of FIG. 26 along the section M1-M2.

Accordingly, according to some embodiments of the present disclosure, embodiments of the present disclosure further provide a photovoltaic module. Referring to FIGS. 26 and 27, the photovoltaic module includes a plurality of cell strings, where each cell string is formed by connecting a plurality of solar cells 8, where each of the plurality of solar cells is the solar cell is the soler cell according to any of the above embodiments or the solar cell prepared by the method of the solar cell according to any of the above embodiments. The photovoltaic module further includes at least one encapsulation adhesive film 840 for covering a surface of each of the plurality of cell strings and at least one cover plate 850 for covering a surface of a corresponding encapsulation adhesive film 840 facing away from the plurality of cell strings.

Specifically, in some embodiments, the plurality of cell strings may be electrically connected by conductive tapes 818, and the conductive tapes 818 are soldered with the electrodes 808 on the cells. FIG. 26 illustrates only a positional relationship between solar cells, i.e., electrodes having a same polarity of the cells are arranged in a same direction. In other words, electrodes having a positive polarity of the cells are arranged face a same side, so that conductive strips are connected to different sides of two adjacent cells, respectively. In some embodiments, the cells may also be arranged in order that the electrodes of different polarities of adjacent cells face the same side, that is, polarities of electrodes of the plurality of adjacent cells facing the same side are respectively a first polarity, a second polarity, a first polarity, and so on, and each conductive tape connects two adjacent cells on the same side.

In some embodiments, no spacing is provided between the cells, i.e., the cells overlap each other.

In some embodiments, the encapsulation adhesive film 840 includes a first encapsulation layer covering one of a front surface and a back surface of each of the solar cells 60 and a second encapsulation layer covering the other of the front surface and the back surface of each of the solar cells 60. Specifically, at least one of the first encapsulation layer and the second encapsulation layer may be an organic encapsulation film, such as a polyvinyl butyral (PVB) film, an ethylene-vinyl acetate copolymer (EVA) film, a polyethylene octene co-elastomer (POE) film, or a polyethylene terephthalate (PET) film.

It shall be understood that there is a division line between the first encapsulation layer and the second encapsulation layer before lamination, and there is no concept of the first encapsulation layer and the second encapsulation layer in the photovoltaic module after the lamination because the first encapsulation layer and the second encapsulation layer have formed an integral encapsulation film 840.

In some embodiments, the cover plate 850 may be a glass cover plate, a plastic cover plate, or the like having a light-transmitting function. Specifically, a surface of the cover plate 850 facing the encapsulation film 840 may be a concave-convex surface, thereby increasing the utilization rate of incident light. The cover plate 850 includes a first cover plate and a second cover plate, where the first cover plate faces the first encapsulation layer and the second cover plate faces the second encapsulation layer.

Although the present disclosure is disclosed as above with preferred embodiments, it is not intended to limit the claims. Any person skilled in the art can make several possible changes and modifications without departing from the concept of the present disclosure. Therefore, the scope of protection of the present disclosure shall be subject to the scope defined in the claims of the present disclosure. Furthermore, the embodiments of the specification and the drawings shown are illustrative only and are not the full scope of the claims of the disclosure.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "has," "having," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

Those of ordinary skill in the art will appreciate that the above-described embodiments are specific embodiments for implementing the present disclosure and that in practical disclosure, various changes may be made in form and detail thereof without departing from the spirit and scope of the present disclosure. Any person skilled in the art may make their own changes and modifications without departing from the spirit and scope of this disclosure, so the scope of protection of this disclosure shall be subject to the scope defined by the claims.

What is claimed is:

1. A solar cell, comprising:
   a substrate having electrode regions and non-electrode regions that are alternately arranged in a first direction, wherein the non-electrode regions include first regions and second regions, wherein each respective second region of the second regions is disposed adjacent to a respective first region of the first regions;
   a dielectric layer formed over the electrode regions and the second regions;
   a doped conductive layer formed over the dielectric layer;
   a passivation layer formed over the first regions and the doped conductive layer; and
   a plurality of electrodes, wherein a respective electrode of the plurality of electrodes is formed over a respective electrode region of the plurality of electrode regions, and the plurality of electrodes penetrate the passivation layer to be in electrical contact with the doped conductive layer;
   wherein the substrate has a first side and a second side opposite to the first side, wherein the respective first region has at least one groove recessed toward the second side, and the passivation layer is formed in the at least one groove; and
   wherein the respective first region includes a third region and a fourth region other than the third region, the at least one groove is located in the third region, and the fourth region has surface roughness equal to or greater than surface roughness of each of the second regions.

2. The solar cell of claim 1, wherein a ratio of a total surface area of the third region of the respective first region to a total surface area of the fourth region of the respective first region ranges from 1:10 to 15:1.

3. The solar cell of claim 1, wherein each of the at least one groove has a size in a range of 0.1 μm to 50 μm.

4. The solar cell of claim 1, wherein each of the at least one groove has a depth ranging from 0.2 μm to 5 μm in a direction perpendicular to a surface of the substrate.

5. The solar cell of claim 1, wherein a ratio of a total surface area of the first regions to a total surface area of the non-electrode regions ranges from 1:6 to 20:21.

6. The solar cell of claim 1, wherein a ratio of a total surface area of the respective first region to a total surface area of the respective second region ranges from 1:2 to 20:1.

7. The solar cell of claim 1, wherein the doped conductive layer has a first side surface facing the respective first region, and an angle between the first side surface and the surface of the respective second region is less than or equal to 90°.

8. The solar cell of claim 7, wherein the first side surface includes a substantially flat surface or a concave-convex surface.

9. The solar cell of claim 1, wherein at least one of a surface of the respective second region or a surface of the respective electrode region includes a substantially flat surface or a concave-convex surface.

10. The solar cell of claim 1, wherein a material of the dielectric layer includes at least one of silicon oxide, silicon carbide, amorphous silicon, and microcrystalline silicon.

11. The solar cell of claim 1, wherein the doped conductive layer includes a first doped conductive layer being doped with one of an N-type doping element and a P-type doping element and a second doped conductive layer being doped with another of the N-type doping element and the P-type doping element; and
   wherein the first doped conductive layer and the second doped conductive layer are formed over the dielectric layer, and the plurality of electrodes include first electrodes and second electrodes that are alternatingly arranged, and wherein the first electrodes penetrate the passivation layer to be in electrical contact with the first doped conductive layer, and the second electrodes penetrate the passivation layer to be in electrical contact with the second doped conductive layer.

12. The solar cell of claim 1, wherein the doped conductive layer includes a plurality of sub-doped conductive layers stacked in sequence in a direction away from the substrate, wherein there is an interface layer provided between two adjacent sub-doped conductive layers of the plurality of sub-doped conductive layers.

13. A method for manufacturing the solar cell of claim 1, comprising:
   providing the substrate having the electrode regions and the non-electrode regions that are alternatingly arranged in the first direction;
   forming the dielectric layer over the electrode regions and the second regions;
   forming the doped conductive layer over the dielectric layer;
   forming the passivation layer over the first regions and the doped conductive layer; and
   forming the plurality of electrodes.

14. A photovoltaic module, comprising:
   a plurality of cell strings, wherein each cell string of the plurality of cell strings is formed by connecting a plurality of solar cells, and each solar cell is the solar cell of claim 1;
   at least one encapsulation adhesive film for covering a surface of each of the plurality of cell strings; and at least one cover plate for covering a surface of a corresponding encapsulation adhesive film of the at least one encapsulation adhesive film away from the plurality of cell strings;

wherein the substrate has a first side and a second side opposite to the first side, wherein the respective first region has at least one groove recessed toward the second side, and the passivation layer is formed in the at least one groove; and wherein the respective first region includes a third region and a fourth region other than the third region, the at least one groove is located in the third region, and the fourth region has surface roughness equal to or greater than surface roughness of each of the second regions.

15. The photovoltaic module of claim 14, wherein a ratio of a total surface area of the third region of the respective first region to a total surface area of the fourth region of the respective first region ranges from 1:10 to 15:1.

16. The solar cell of claim 1, wherein the dielectric layer is not formed over the first regions.

\* \* \* \* \*